US012660455B2

(12) United States Patent
Wang et al.

(10) Patent No.: US 12,660,455 B2
(45) Date of Patent: Jun. 16, 2026

(54) DISPLAY SUBSTRATE HAVING VOLTAGE SIGNAL TRANSMISSION STRUCTURE AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Mengqi Wang, Beijing (CN); Tiaomei Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 292 days.

(21) Appl. No.: 18/262,213

(22) PCT Filed: Jul. 25, 2022

(86) PCT No.: PCT/CN2022/107710
§ 371 (c)(1),
(2) Date: Jul. 20, 2023

(87) PCT Pub. No.: WO2024/020750
PCT Pub. Date: Feb. 1, 2024

(65) Prior Publication Data
US 2024/0407217 A1     Dec. 5, 2024

(51) Int. Cl.
*H10K 59/131*     (2023.01)
*H10K 59/121*     (2023.01)
(Continued)

(52) U.S. Cl.
CPC ..... *H10K 59/1315* (2023.02); *H10K 59/1213* (2023.02); *H10K 59/8792* (2023.02); *H10K 59/88* (2023.02)

(58) Field of Classification Search
None
See application file for complete search history.

(56) References Cited

U.S. PATENT DOCUMENTS

| | | | |
|---|---|---|---|
| 6,002,155 A | 12/1999 | Tahara et al. | |
| 2004/0196705 A1 | 10/2004 | Ishikura et al. | |

(Continued)

FOREIGN PATENT DOCUMENTS

| | | |
|---|---|---|
| CN | 1612669 A | 5/2005 |
| CN | 110708790 A | 1/2020 |

(Continued)

OTHER PUBLICATIONS

Extended European Search Report for corresponding Application No. EP 22952217.2, dated Jun. 18, 2025, 7 pages.

(Continued)

*Primary Examiner* — Nduka E Ojeh
(74) *Attorney, Agent, or Firm* — Dority & Manning, P.A.

(57) ABSTRACT

Embodiments of the present disclosure provide a display substrate and a display apparatus. The display substrate has a display region and a peripheral region around the display region. The display substrate includes a substrate, a first voltage signal transmission structure and a light-emitting device layer that are arranged in sequence. The light-emitting device layer includes an anode layer and a cathode layer, and the anode layer is closer to the substrate than the cathode layer. The first voltage signal transmission structure is configured to transmit a first voltage signal to the cathode layer. The first voltage signal transmission structure includes a first portion located in the display region and a second (Continued)

portion located in the peripheral region, and the first portion is electrically connected to the second portion.

18 Claims, 22 Drawing Sheets

(51) Int. Cl.
    *H10K 59/80*          (2023.01)
    *H10K 59/88*          (2023.01)

(56)                References Cited

U.S. PATENT DOCUMENTS

| | | |
|---|---|---|
| 2015/0310801 A1 | 10/2015 | Lin et al. |
| 2017/0235865 A1 | 8/2017 | Preuthen et al. |
| 2018/0204895 A1 | 7/2018 | Lin et al. |
| 2019/0207150 A1 | 7/2019 | Kwon et al. |
| 2020/0176541 A1* | 6/2020 | Xu ..................... H10K 50/824 |
| 2020/0279521 A1 | 9/2020 | Ma et al. |
| 2021/0376209 A1 | 12/2021 | Wang et al. |
| 2022/0013617 A1 | 1/2022 | Cha et al. |
| 2022/0020827 A1* | 1/2022 | Liu ....................... H10K 71/00 |
| 2022/0102466 A1 | 3/2022 | Qiu et al. |
| 2022/0123095 A1 | 4/2022 | Cheng |
| 2022/0359639 A1 | 11/2022 | Yi et al. |
| 2023/0157095 A1 | 5/2023 | Xu et al. |
| 2023/0161428 A1 | 5/2023 | Yan |

FOREIGN PATENT DOCUMENTS

| | | |
|---|---|---|
| CN | 210349841 U | 4/2020 |
| CN | 210429887 U | 4/2020 |
| CN | 211265479 U | 8/2020 |
| CN | 111785742 A | 10/2020 |
| CN | 111948859 A | 11/2020 |
| CN | 212256866 U | 12/2020 |
| CN | 215494957 U | 1/2022 |
| CN | 114203739 A | 3/2022 |
| JP | H07326615 A | 12/1995 |
| JP | 2000174141 A | 6/2000 |
| WO | WO 2022/151534 A1 | 7/2022 |

OTHER PUBLICATIONS

Notification of Grant of Invention Patent Rights (w/ English translation) for corresponding CN Application No. 202280002347.2, dated Jun. 19, 2023, 7 pages.

Chinese Office Action (w/ English translation) for corresponding CN Application No. 202280002347.2, dated Jan. 18, 2023, 14 pages.

Chinese Office Action (w/ English translation) for corresponding CN Application No. 202280002347.2, dated Apr. 12, 2023, 15 pages.

Indian Examination Report for corresponding Application No. 202447053854, dated Feb. 24, 2026, 9 pages.

\* cited by examiner

AA1~AA

DISPLAY SUBSTRATE HAVING VOLTAGE SIGNAL TRANSMISSION STRUCTURE AND DISPLAY APPARATUS

CROSS-REFERENCE TO RELATED APPLICATION

This application is a national phase entry under 35 USC 371 of International Patent Application No. PCT/CN2022/107710, filed on Jul. 25, 2022, which is incorporated herein by reference in its entirety.

TECHNICAL FIELD

The present disclosure relates to the field of display technologies, and in particular, to a display substrate and a display apparatus.

BACKGROUND

With the continuous development of display technologies, display apparatuses have gradually spread throughout people's lives. Organic light-emitting diode (OLED) display panels are widely used in mobile phones, televisions, notebook computers, and other smart products due to their advantages such as self-illumination, low power consumption, wide viewing angle, fast response, and high contrast. Narrowing the bezel is an important development direction of the display apparatus at present, and how to reduce the width of the bezel of the display apparatus is an urgent problem to be solved currently.

SUMMARY

In an aspect, a display substrate is provided. The display substrate has a display region and a peripheral region around the display region. The display substrate includes a substrate, a first voltage signal transmission structure and a light-emitting device layer. The light-emitting device layer includes an anode layer and a cathode layer, and the anode layer is closer to the substrate than the cathode layer. The first voltage signal transmission structure is configured to transmit a first voltage signal to the cathode layer in the light-emitting device layer. The first voltage signal transmission structure includes a first portion located in the display region and a second portion located in the peripheral region. The first portion of the first voltage signal transmission structure is electrically connected to the second portion of the first voltage signal transmission structure.

In some embodiments, the first portion of the first voltage signal transmission structure includes a pattern in a mesh structure; and/or, the first portion of the first voltage signal transmission structure includes a plurality of first voltage signal lines.

In some embodiments, a boundary of the display region of the display substrate includes a plurality of boundary lines, and the second portion of the first voltage signal transmission structure includes a first bus and a second bus. A boundary line in the plurality of boundary lines included in the boundary of the display region is a selected boundary line. The first bus extends in an extension direction of the selected boundary line and is configured to receive a first voltage signal. The second bus is disposed on a periphery of remaining boundary lines, except for the selected boundary line, in the plurality of boundary lines included in the boundary of the display region. An orthographic projection of the second bus on the substrate and an orthographic projection of the first bus on the substrate have no overlap.

In some embodiments, the first portion of the first voltage signal transmission structure is connected to the second bus included in the second portion of the first voltage signal transmission structure. The first voltage signal transmission structure further includes a plurality of connecting lines, and the first portion of the first voltage signal transmission structure is connected to the first bus included in the second portion of the first voltage signal transmission structure through the plurality of connecting lines.

In some embodiments, the display substrate further includes a first source-drain conductive layer disposed on the side of the substrate, and a second source-drain conductive layer disposed on a side of the first source-drain conductive layer away from the substrate. The first voltage signal transmission structure is located between the second source-drain conductive layer and the anode layer. The anode layer includes a plurality of anodes located in the display region and an overlapping anode located in the peripheral region, and the overlapping anode is electrically insulated from the plurality of anodes in the display region. The second portion of the first voltage signal transmission structure is electrically connected to the cathode layer in the light-emitting device layer by the overlapping anode in the peripheral region.

In some embodiments, the display region of the display substrate includes a first display region and a second display region, and the first display region surrounds the second display region. The plurality of anodes in the display region include a plurality of first anodes located in the first display region and a plurality of second anodes located in the second display region.

The display substrate further includes a plurality of pixel circuits disposed on the side of the substrate and one or more transparent conductive layers disposed on a side of the second source-drain conductive layer away from the substrate. The plurality of pixel circuits are located in the first display region and not located in the second display region. Each transparent conductive layer includes a plurality of first transfer electrodes located in the first display region, a plurality of second transfer electrodes located in the second display region, and a first pattern located at least in a part of a region of the first display region except for a region where the plurality of first transfer electrodes are located.

Each first transfer electrode is electrically connected to a first anode, and each second transfer electrode is electrically connected to a second anode. The first pattern includes a plurality of mesh holes. At least one transparent conductive layer in the one or more transparent conductive layers is a selected transparent conductive layer, and a first pattern of the selected transparent conductive layer is configured to transmit the first voltage signal. The first portion of the first voltage signal transmission structure includes a portion of the first pattern of the selected transparent conductive layer located in the display region.

In some embodiments, each transparent conductive layer in the one or more transparent conductive layers is the selected transparent conductive layer. The first pattern of the selected transparent conductive layer is further located in the peripheral region, and the second portion of the first voltage signal transmission structure includes a portion of the first pattern of the selected transparent conductive layer located in the peripheral region. The first pattern of each transparent conductive layer is used as the first voltage signal transmission structure. Portions of all of the one or more transparent conductive layers located in the peripheral region are electrically connected. A portion, located in the peripheral region, of a first pattern of a transparent conductive layer farthest away from the substrate in the one or more transparent conductive layers is connected to the overlapping anode.

In some embodiments, a surface of the substrate on which the one or more transparent conductive layers are disposed includes a plurality of sides. The display substrate further includes at least one planarization layer. The one or more transparent conductive layers include a first transparent conductive layer, a second transparent conductive layer and a third transparent conductive layer that are disposed sequentially from the substrate. The at least one planarization layer includes: a first planarization layer located between the first transparent conductive layer and the second transparent conductive layer, a second planarization layer located between the second transparent conductive layer and the third transparent conductive layer, and a third planarization layer located on a side of the third transparent conductive layer away from the substrate.

A distance between an edge of an orthographic projection of the third planarization layer on the substrate and a side of the substrate to which the edge is close is greater than a distance between an edge of an orthographic projection of the second planarization layer on the substrate and the side of the substrate to which the edge is close. The distance between the edge of the orthographic projection of the second planarization layer on the substrate and the side of the substrate to which the edge is close is greater than a distance between an edge of an orthographic projection of the first planarization layer on the substrate and the side of the substrate to which the edge is close. A distance between an edge of an orthographic projection of the at least one transparent conductive layer on the substrate and the side of the substrate is smaller than the distance between the edge of the orthographic projection of the first planarization layer on the substrate and the side of the substrate. The portion of the first pattern used as the first voltage signal transmission structure located in the peripheral region is connected to the overlapping anode.

In some embodiments, the one or more transparent conductive layers include a first transparent conductive layer, a second transparent conductive layer and a third transparent conductive layer that are disposed sequentially from the substrate. A first pattern of the second transparent conductive layer is used as the first voltage signal transmission structure. The first pattern of the second transparent conductive layer is further located in the peripheral region, and a portion of the first pattern of the second transparent conductive layer located in the peripheral region is connected to the overlapping anode included in the anode layer. A first pattern of the first transparent conductive layer and a first pattern of the third transparent conductive layer are configured to transmit a second voltage signal to the plurality of pixel circuits in the first display region.

In some embodiments, the display substrate further includes an additional metal layer, and the additional metal layer is located in a same layer as the selected transparent conductive layer. The additional metal layer includes a second pattern, and the second pattern is located at least in a part of a region of the first display region except for the region where the plurality of first transfer electrodes are located. The second pattern of the additional metal layer is configured to transmit the first voltage signal, and the first voltage signal transmission structure includes the second pattern of additional metal layer.

In some embodiments, the display substrate further includes an additional metal layer, and the additional metal layer is disposed on a side of the selected transparent conductive layer away from the substrate. The additional metal layer includes a second pattern, the second pattern of the additional metal layer is disposed on a side of the first pattern of the selected transparent conductive layer, and the second pattern of the additional metal layer is electrically connected to the first pattern of the selected transparent conductive layer. The first voltage signal transmission structure further includes the second pattern of the additional metal layer.

In some embodiments, the plurality of pixel circuits are arranged in an array, and include a plurality of first pixel circuits, a plurality of second pixel circuits and a plurality of dummy pixel circuits. Each first pixel circuit is electrically connected to a first anode, each second pixel circuit is electrically connected to a second anode, and the plurality of dummy pixel circuits are electrically insulated from the anode layer. The plurality of pixel circuits are arranged into a plurality of pixel circuit columns, at least one pixel circuit column is a normal pixel circuit column, and at least one pixel circuit column is a dummy pixel circuit column. The normal pixel circuit column includes first pixel circuits and/or second pixel circuits, and the dummy pixel circuit column includes dummy pixel circuits.

The second source-drain conductive layer includes a plurality of voltage signal lines, and each voltage signal line is electrically connected to a pixel circuit column. The plurality of voltage signal lines include a plurality of first voltage signal lines and a plurality of second voltage signal lines, each second voltage signal line is electrically connected to a corresponding normal pixel circuit column, and each first voltage signal line is electrically connected to a corresponding dummy pixel circuit column. Each second voltage signal line is configured to transmit a second voltage signal to each pixel circuit in the corresponding normal pixel circuit column. The plurality of first voltage signal lines are configured to transmit the first voltage signal. The first voltage signal transmission structure further includes the plurality of first voltage signal lines.

In some embodiments, the first pattern of the selected transparent conductive layer is further located in the peripheral region, and the plurality of first voltage signal lines included in the plurality of voltage signal lines included in the second source-drain conductive layer are electrically connected to the first pattern of the selected transparent conductive layer in the peripheral region.

In some embodiments, the display substrate further includes a plurality of pixel circuits arranged in an array on a side of the substrate, a gate conductive layer disposed on the side of the substrate, a first source-drain conductive layer disposed on a side of the gate conductive layer away from the substrate, and a second source-drain conductive layer disposed on a side of the first source-drain conductive layer away from the substrate. The plurality of pixel circuits are arranged into a plurality of pixel circuit columns. The second source-drain conductive layer includes a plurality of voltage signal lines extending in a first direction. The first direction is an extension direction of the plurality of pixel circuit columns. Each voltage signal line overlaps with a pixel circuit column.

The plurality of voltage signal lines include a plurality of first voltage signal lines and a plurality of second voltage signal main lines. The plurality of first voltage signal lines are configured to transmit the first voltage signal, and the first voltage signal transmission structure further includes the plurality of first voltage signal lines. Each second voltage signal main line is electrically connected to a pixel circuit column, and is configured to transmit a second voltage signal to each pixel circuit connected thereto in the pixel circuit column.

The gate conductive layer includes a plurality of second voltage signal auxiliary lines extending in a second direction. The plurality of second voltage signal auxiliary lines are electrically connected to the second voltage signal main line, and the plurality of second voltage signal auxiliary lines are configured to transmit the second voltage signal to pixel circuits overlapping with a first voltage signal line.

In some embodiments, at least one first voltage signal line in the plurality of first voltage signal lines is disposed between every two adjacent second voltage signal main lines in the plurality of second voltage signal main lines, and/or at least one second voltage signal main line in the plurality of second voltage signal main lines is disposed between every two adjacent first voltage signal lines in the plurality of first voltage signal lines.

In some embodiments, the display substrate further includes one or more transparent conductive layers disposed on a side of the second source-drain conductive layer away from the substrate, and at least one planarization layer disposed on the side of the second source-drain conductive layer away from the substrate. At least one transparent conductive layer in the one or more transparent conductive layers is a selected transparent conductive layer, the selected transparent conductive layer includes a first pattern located in both the display region and the peripheral region, and the first pattern of the selected transparent conductive layer is electrically connected to the plurality of first voltage signal lines in the peripheral region.

In some embodiments, the display substrate further includes a light-shielding layer disposed on the side of the substrate, and a plurality of pixel circuits disposed on a side of the light-shielding layer away from the substrate. Each pixel circuit in the plurality of pixel circuits includes a driving transistor. The light-shielding layer includes a plurality of light-shielding patterns, an orthographic projection of the driving transistor of each pixel circuit on the substrate is within an orthographic projection of a light-shielding pattern on the substrate. The plurality of light-shielding patterns are connected together. The light-shielding layer is configured to transmit the first voltage signal, and the first voltage signal transmission structure further includes the light-shielding layer.

In some embodiments, the display substrate further includes a first source-drain conductive layer and a second source-drain conductive layer that are disposed sequentially from the substrate. The second portion of the first voltage signal transmission structure includes a first voltage signal bus, and the first portion of the first voltage signal transmission structure includes a plurality of first voltage signal sub-lines. The first voltage signal bus is located in the first source-drain conductive layer and/or located in the second source-drain conductive layer. A dimension of the first voltage signal bus in a direction perpendicular to an extending direction thereof is in a range of 5 μm to 20 μm, inclusive.

In another aspect, a display apparatus is provided. The display apparatus includes the display substrate as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method, and an actual timing of a signal to which the embodiments of the present disclosure relate.

DETAILED DESCRIPTION

Figure 1:
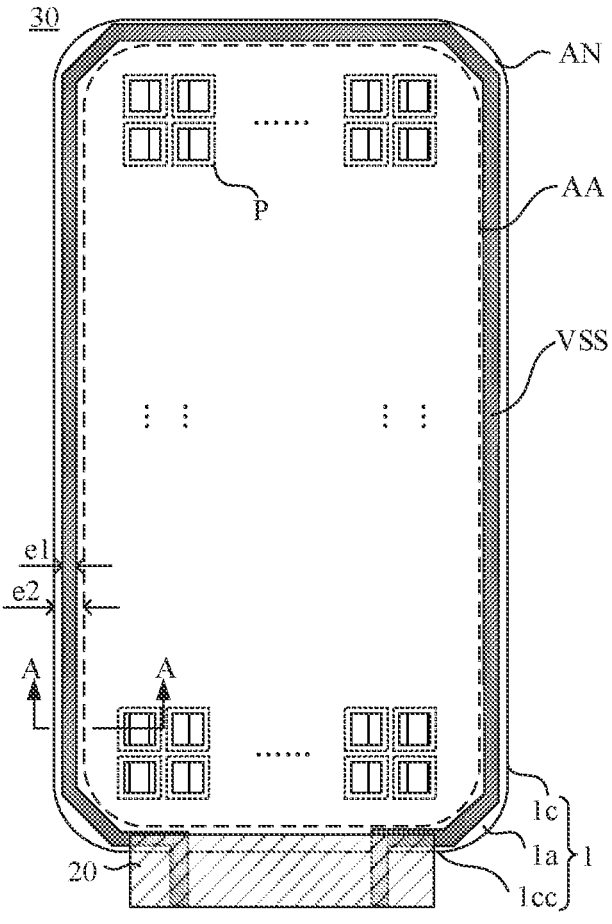
FIG. 1 is a structural diagram of a first voltage signal transmission line in a display substrate, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "applicable to" or "configured to" as used herein indicates an open and inclusive expression, which does not exclude devices that are applicable to or configured to perform additional tasks or steps.

The term "about", "substantially", or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

With the development of the industry, narrow bezels or even zero bezels of display apparatuses have become an industry development trend. How to increase a proportion of a display region in the display apparatus, that is, how to increase an area ratio of a region of a display image to a display surface of a whole display apparatus has become one of problems to be solved in the industry.

The display apparatus includes a display substrate, and a type of the display substrate may vary, which may be set according to actual needs.

For example, the display substrate may include an organic light-emitting diode (OLED) display substrate, a quantum dot light-emitting diode (QLED) display substrate, or a micro light-emitting diode (micro LED) display substrate, which is not specifically limited in the present disclosure.

Some embodiments of the present disclosure will be schematically described below by considering an example in which the display substrate is the OLED display substrate.

Figure 2:
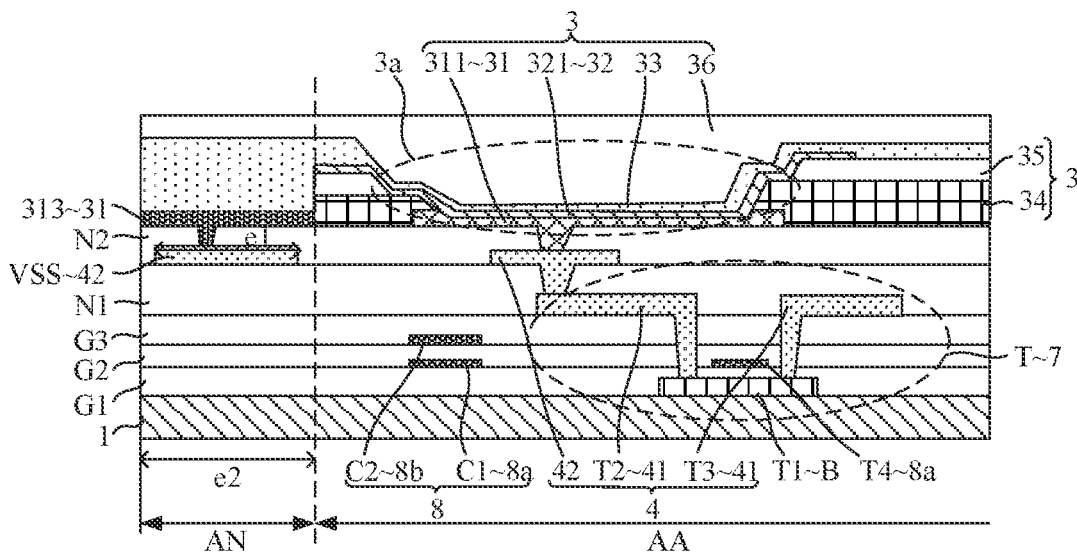
FIG. 2 is a sectional view taken along a section line AA in FIG. 1.

In some embodiments, as shown in FIGS. 1 and 2, the display substrate 30 includes a display region AA and a peripheral region AN around the display region AA. The display region AA is provided with a plurality of sub-pixels P therein, and the plurality of sub-pixels P are, for example, arranged in an array. Each sub-pixel P includes a light-emitting device 3a and a pixel circuit 7 that are disposed on a substrate 1, and the pixel circuit 7 includes a plurality of thin film transistors T and capacitor(s).

The display substrate 30 includes the substrate 1, a driving circuit layer and a light-emitting device layer 3 that are sequentially disposed. The driving circuit layer includes a plurality of pixel circuits 7, and the driving circuit layer includes, for example, a semiconductor layer B, a first gate insulating layer G1, a first gate conductive layer 8a, a second gate insulating layer G2, a second gate conductive layer 8b, an interlayer insulating layer G3, a first source-drain conductive layer 41, a first insulating layer N1, the second source-drain conductive layer 42, and a second insulating layer N2 that are arranged from bottom to top. A thin film transistor T includes an active layer T1, a source T2, a drain T3 and a gate T4. The active layer T1 is located in the semiconductor layer B, the gate T4 is located in the first gate conductive layer 8a, and the source T2 and the drain T3 are located in the first source-drain conductive layer 41. A lower electrode plate C1 of the capacitor is located in the first gate conductive layer 8a, and an upper electrode plate C2 of the capacitor is located in the second gate conductive layer 8b.

The light-emitting device layer 3 includes a plurality of light-emitting devices 3a, and the light-emitting device layer 3 includes an anode layer 31, a light-emitting functional layer 32, a cathode layer 33, a pixel defining layer 34, a spacer 35 and an encapsulation layer 36. The pixel defining layer 34 is disposed on a side of the anode layer 31 away from the substrate 1. The anode layer 31 includes a plurality of first anodes 311 and an overlapping anode 313. The pixel defining layer 34 is provided with a plurality of openings therein, each opening exposes at least a part of a first anode 311, and each light-emitting device 3a is disposed in an opening. In the display region AA, an orthographic projection of an outline of each opening of the pixel defining layer 34 on the substrate 1 is within an orthographic projection of the first anode 311 on the substrate 1. The light-emitting functional layer 32 is disposed on a side of the anode layer 31 away from the substrate 1. The light-emitting functional layer 32 includes a plurality of light-emitting portions 321, and each light-emitting portion 321 is located in an opening. The spacer 35 is disposed between the pixel defining layer 34 and the light-emitting functional layer 32.

In some embodiments, the light-emitting functional layer 32 only includes a light-emitting layer. In some other embodiments, in addition to the light-emitting layer, the light-emitting functional layer 32 further includes at least one of an electron transport layer (ETL), an electron injection layer (EIL), a hole transport layer (HTL) and a hole injection layer (HIL).

For example, the material of the anode layer 31 may be at least one of indium tin oxide (ITO), indium zinc oxide (IZO), gold (Au), platinum (Pt) or silicon (Si).

In the sub-pixel P, the first anode 311 of the light-emitting device 3a is electrically connected to the source T2 or the drain T3 of one of the plurality of thin film transistors T included in the pixel circuit 7. FIG. 2 shows an example where the first anode 311 is electrically connected to the source T2 of the thin film transistor T. It will be noted that the source T2 and the drain T3 may be interchanged, that is, T2 in FIG. 2 represents the drain, and T3 in FIG. 2 represents the source. In some examples, as shown in FIG. 2, the source T2 or the drain T3 of the thin film transistor is electrically connected to the first anode 311 by a transfer electrode located in the second source-drain conductive layer 42.

As shown in FIGS. 1 and 2, the display substrate 30 further includes a first voltage signal transmission line VSS disposed in the peripheral region AN. The first voltage signal transmission line VSS is disposed around the display region AA, and is configured to transmit a first voltage signal (a Vss signal) to the cathode layer of the light-emitting device layer 3, so that the cathode layer 33 receives the first voltage. The display substrate 30 further includes a second voltage signal transmission line. The second voltage signal transmission line is configured to transmit a second voltage signal (a Vdd signal) to the pixel circuit 7 in the sub-pixel P, so that the anode layer 31 of the light-emitting device layer 3 receives a driving signal generated by each pixel circuit 7. When the cathode layer 33 and the anode layer 31 of the light-emitting device layer 3 respectively receive the first voltage and a voltage of the driving signal, the light-emitting functional layer 32 located between the cathode layer 33 and the anode layer 31 emits light.

All film layers included in the driving circuit layer are introduced as follows. A material of the semiconductor layer B includes amorphous silicon, monocrystalline silicon, polycrystalline silicon, or metal-oxide-semiconductor materials. For example, the material of the semiconductor layer B includes indium gallium zinc oxide (IGZO) or zinc oxide (ZnO), and the present disclosure is not limited thereto. The semiconductor layer B includes active layers T1 of all the transistors.

Overlapping portions of the first gate conductive layer 8a and the semiconductor layer B form transistors respectively. A material of the first gate conductive layer 8a includes a conductive metal. For example, the material of the first gate conductive layer 8a includes at least one of aluminum, copper, or molybdenum, and the present disclosure is not limited thereto. The first gate conductive layer 8a includes gates of all the transistors and a plurality of gate scanning lines.

The first gate insulating layer G1 is disposed between the semiconductor layer B and the first gate conductive layer 8a, and used to electrically insulate the semiconductor layer B from the first gate conductive layer 8a. A material of the first gate insulating layer G1 includes any of silicon nitride, silicon oxynitride, silicon oxide, and other inorganic insulating materials. For example, the material of the first gate insulating layer G1 includes silicon dioxide, and the present disclosure is not limited thereto.

The second gate insulating layer G2 is disposed between the first gate conductive layer 8a and the second gate conductive layer 8b, and used to electrically insulate the first gate conductive layer 8a from the second gate conductive layer 8b. A material of the second gate insulating layer G2 includes any of silicon nitride, silicon oxynitride, silicon oxide, and other inorganic insulating materials. For example, the material of the second gate insulating layer G2 includes silicon dioxide, and the present disclosure is not limited thereto.

The interlayer insulating layer G3 is disposed between the first source-drain conductive layer 41 and the second gate conductive layer 8b, and used to electrically insulate the first source-drain conductive layer 41 from the second gate conductive layer 8b. A material of the interlayer insulating layer G3 includes any of silicon nitride, silicon oxynitride, silicon oxide, and other inorganic insulating materials.

The first source-drain conductive layer 41 includes a plurality of first signal lines (e.g., data lines), a plurality of first electrodes and the like.

The second source-drain conductive layer 42 includes a plurality of second signal lines (e.g., second voltage signal transmission lines), a plurality of second electrodes and the like.

In some embodiments, the first voltage signal transmission line VSS is located in the second source-drain conductive layer 42, that is, the second source-drain conductive layer 42 includes the plurality of second signal lines located in the display region, and the first voltage signal transmission line VSS located in the peripheral region.

As shown in FIG. 2, the anode layer 31 further includes the overlapping anode 313 disposed in the peripheral region AN. The overlapping anode 313 is connected to the first voltage signal transmission line VSS and connected to the cathode layer 33, so as to transmit the first voltage signal (the Vss signal) transmitted by the first voltage signal transmission line VSS to the cathode layer 33 through the overlapping anode 313.

It will be noted that the overlapping anode 313 is only a pattern located in the same layer as a plurality of anodes, and used to connect the first voltage signal transmission line VSS and the cathode layer, but is not used in the light-emitting device. The overlapping anode is electrically insulated from any anode. For example, the overlapping anode 313 is a pattern surrounding the display region.

In order to ensure the effective transmission of the first voltage signal transmitted by the first voltage signal transmission line VSS and reduce transmission power consumption and signal loss as much as possible, a width of the first voltage signal transmission line VSS cannot be too small, but should have a certain size, so that the first voltage signal transmission line VSS has a small resistance. However, this will occupy a certain area in the peripheral region, causing a width of the peripheral region to be too large and reducing a screen-to-body ratio of the display substrate.

In order to increase a proportion of an area of the display region AA to an area of the display surface of the display apparatus, the dimension of the peripheral region AN in a direction perpendicular to an edge of the display region AA may be reduced, such as the dimension e2 shown in FIG. 1. As a result, the bezel of the display apparatus may be narrowed, thereby increasing the proportion of the area of the display region AA to the area of the display surface. The peripheral region AN is provided therein with the first voltage signal transmission line VSS configured to transmit the first voltage signal (the Vss signal) to the light-emitting device layer 3. The dimension of the first voltage signal transmission line VSS in a direction perpendicular to the edge adjacent thereto of the display region AA may be reduced, such as the dimension e1 shown in FIG. 1, so as to narrow the bezel. However, in a case where other structures are the same, it can be understood that, reducing the width of the first voltage signal transmission line VSS causes an cross-sectional area of the first voltage signal transmission line VSS to be reduced, and thus the first voltage signal (the Vss signal) transmitted by the first voltage signal transmission line VSS may change, so as to cause a voltage drop of the first voltage. In order to ensure stable transmission of signals required for work, the power consumption of the display apparatus may increase.

In light of this, some embodiments of the present disclosure provide a display substrate. By redesigning the structure of the first voltage signal transmission line VSS, the effect of narrowing the bezel may be achieved.

The display panel and the display apparatus provided by the present disclosure will be introduced below.

Figure 3:
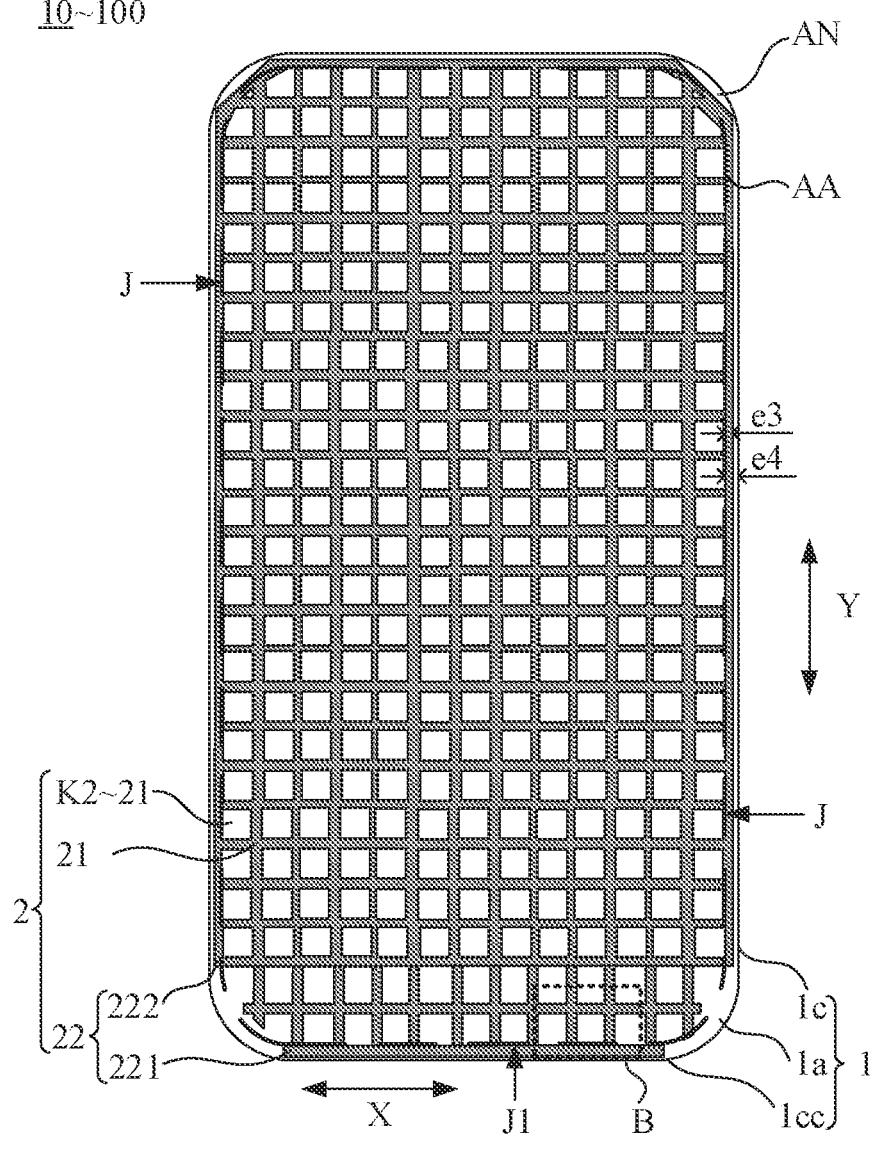
FIG. 3 is a structural diagram of a first voltage signal transmission structure in a display substrate, in accordance with some embodiments.
Figure 4:
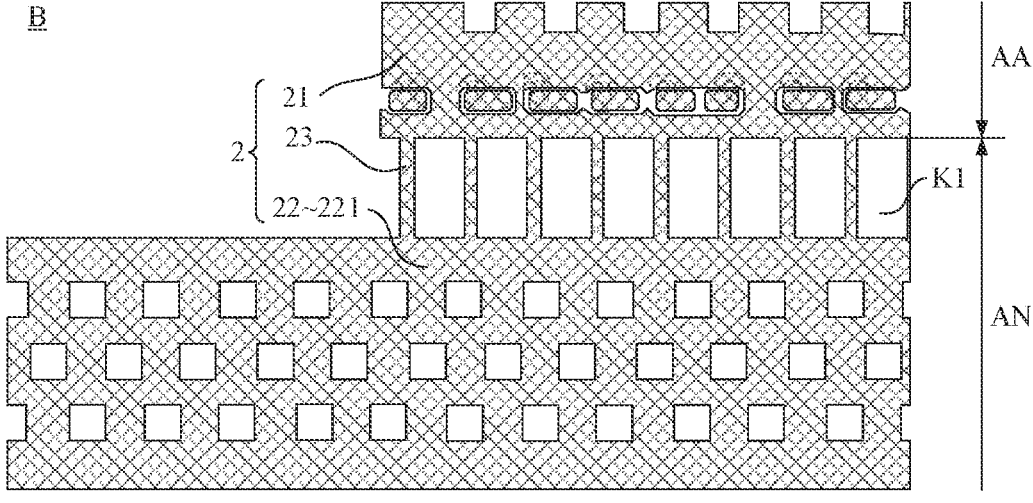
FIG. 4 is an enlarged view of a region B in FIG. 3.
Figure 6:
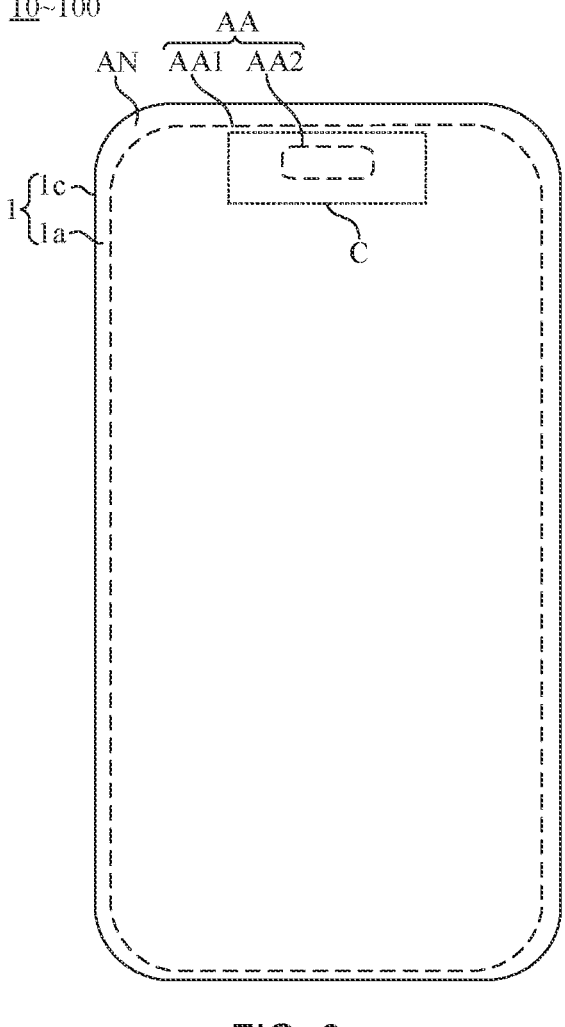
FIG. 6 is a plan view of a structure of another display substrate, in accordance with some embodiments.
Figure 7:
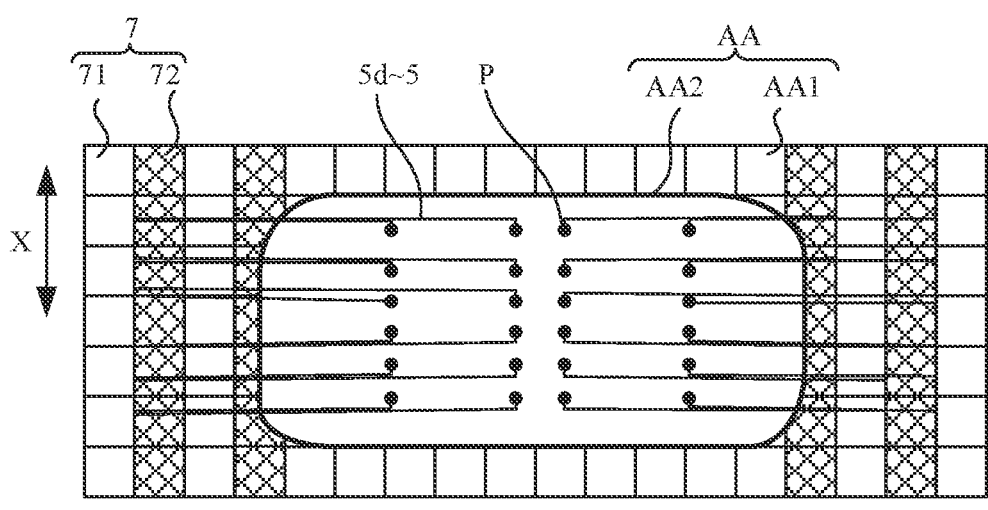
FIG. 7 is an enlarged view of a region C in FIG. 6.

In the present disclosure, FIGS. 3 and 6 are each a plan view of a structure of a display substrate 10, FIG. 4 is an enlarged view of a region B in FIG. 3, and FIG. 7 is an enlarged view of a region C in FIG. 6.

Figure 12A:
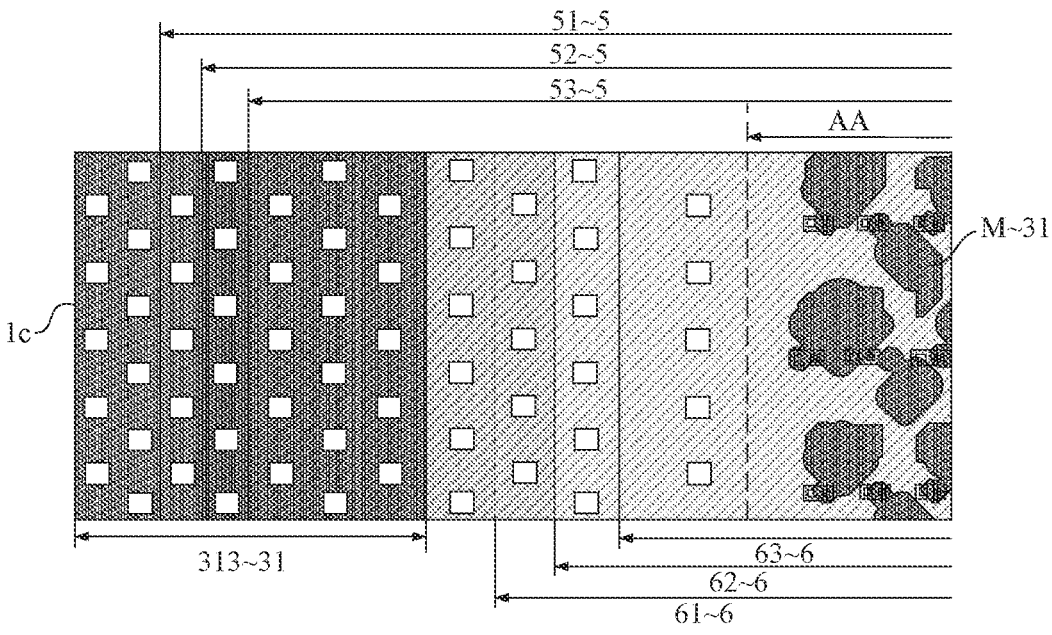
FIG. 12A is a structural diagram of film layers in a peripheral region of a display substrate, in accordance with some embodiments.

FIG. 12A is a diagram of a structure of film layers in a peripheral region of the display substrate 10. FIGS. 5, 13A, 13B and 19 are each a sectional view of the structure of the film layers in the peripheral region of the display substrate 10. In order to clearly describe details of the structure of transparent conductive layer(s), planarization layer(s) and an overlapping anode in the peripheral region, a plurality of anodes M and other structures in the display region AA of the display substrate 10 in FIG. 12A are removed to obtain structural diagrams of each transparent conductive layer, each planarization layer or the overlapping anode in the peripheral region of the substrate in FIGS. 12B to 12H.

Figure 8:
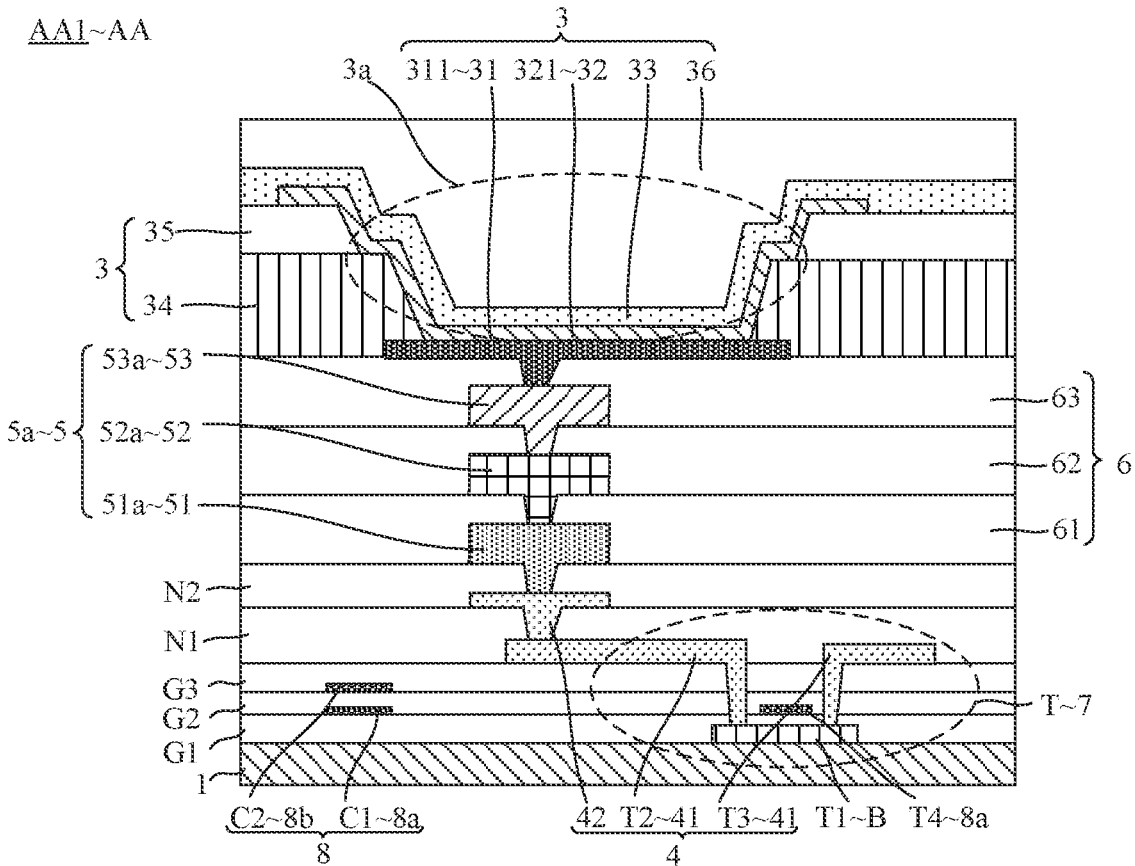
FIG. 8 is a sectional view of a structure of a first display region of a display substrate, in accordance with some embodiments.
Figure 9A:
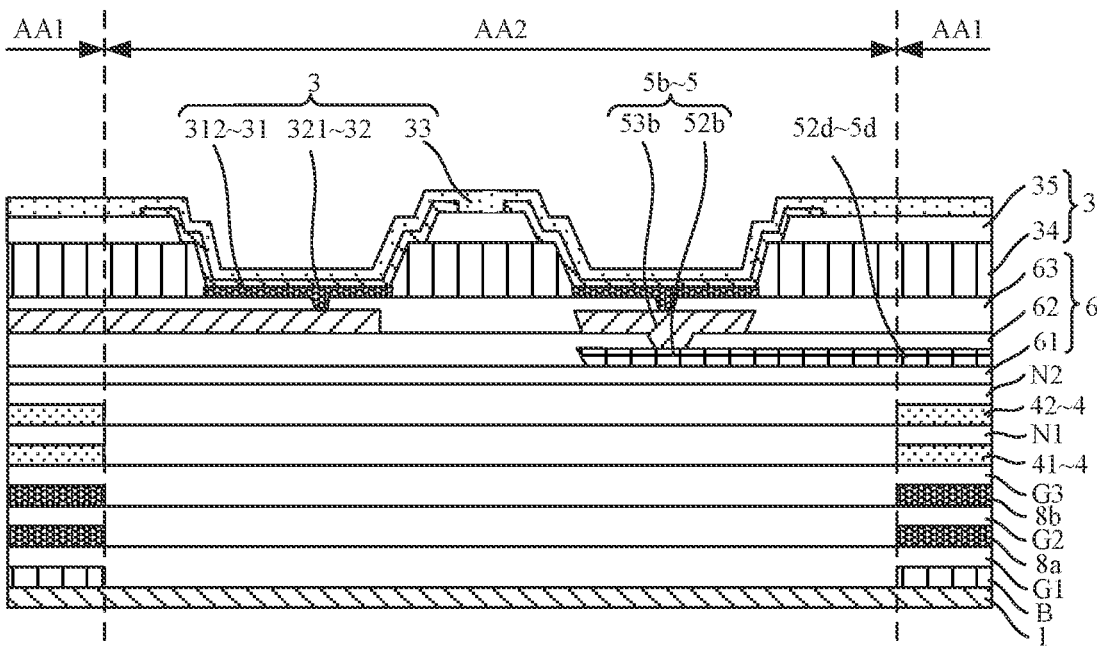
FIG. 9A is a sectional view of a structure of a second display region of a display substrate, in accordance with some embodiments.
Figure 9B:
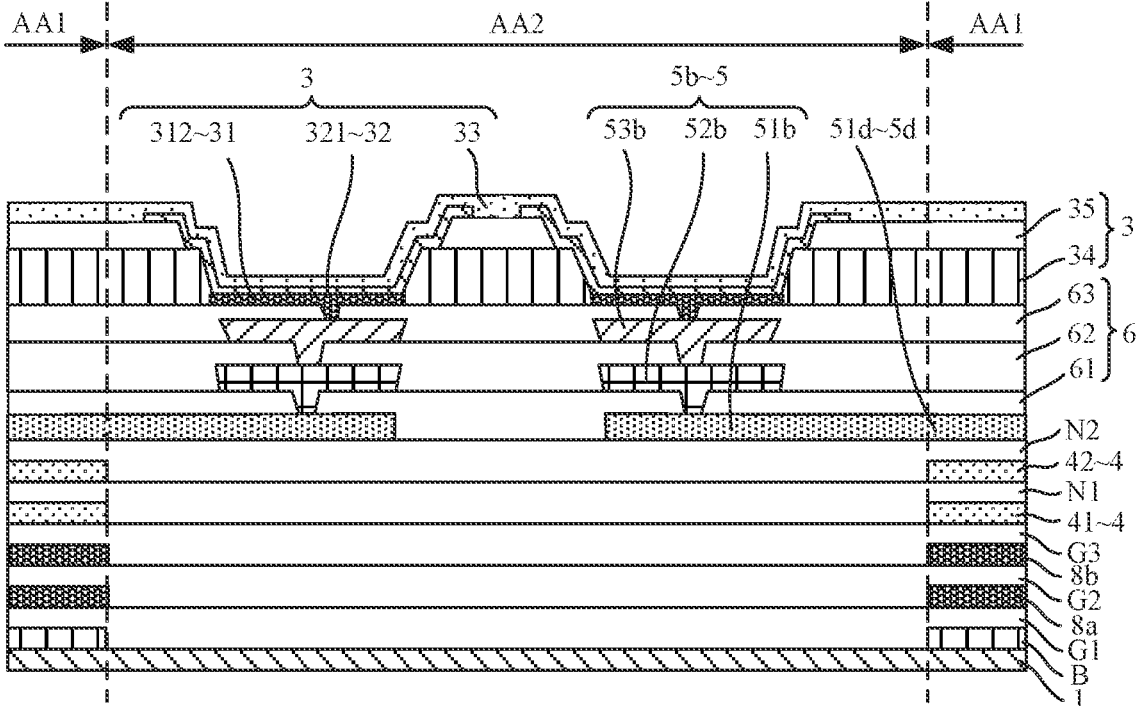
FIG. 9B is a sectional view of a structure of a second display region of another display substrate, in accordance with some embodiments.
Figure 10:
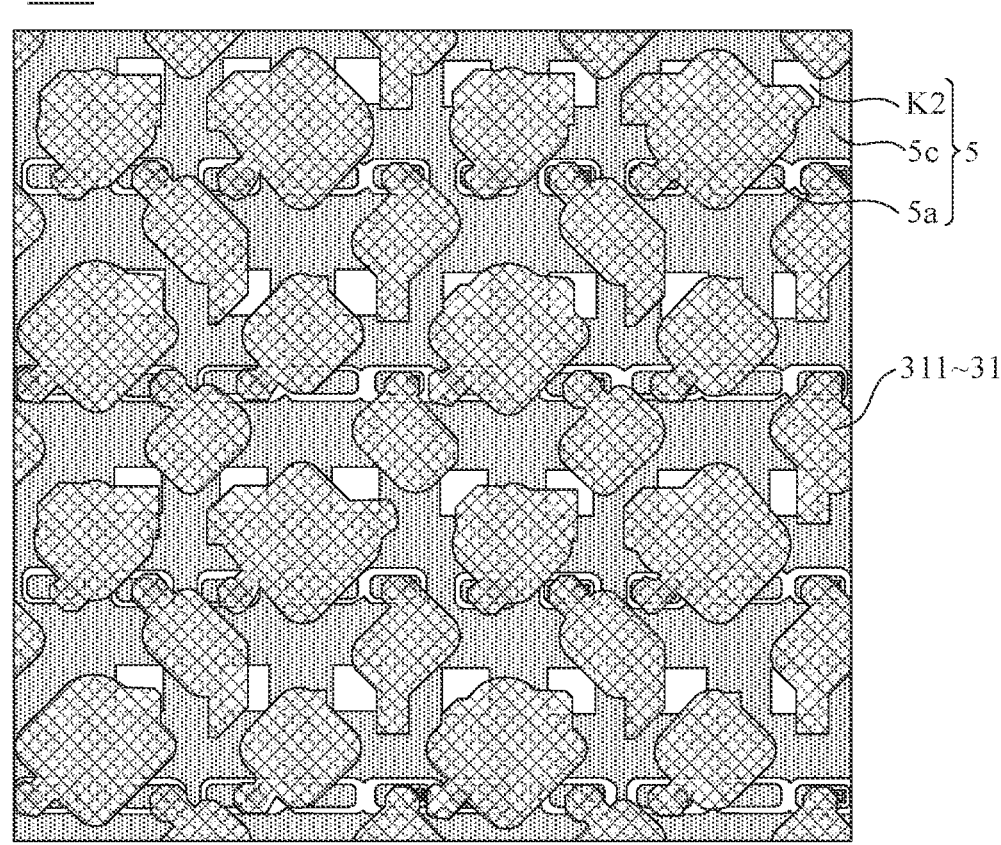
FIG. 10 is an enlarged view of portions of a transparent conductive layer and an anode layer located in a first display region, in accordance with some embodiments.
Figure 11A:
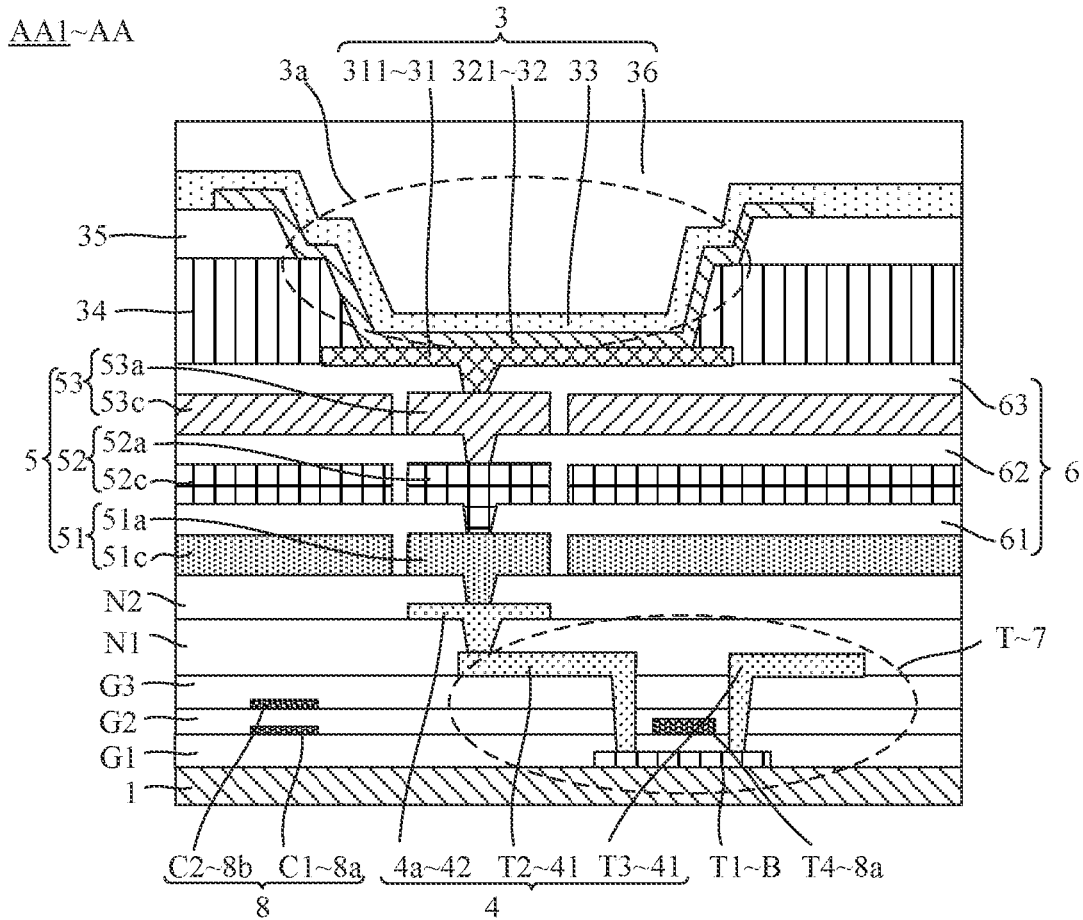
FIG. 11A is a sectional view of a first display region of a display substrate, in accordance with some embodiments.
Figure 11B:
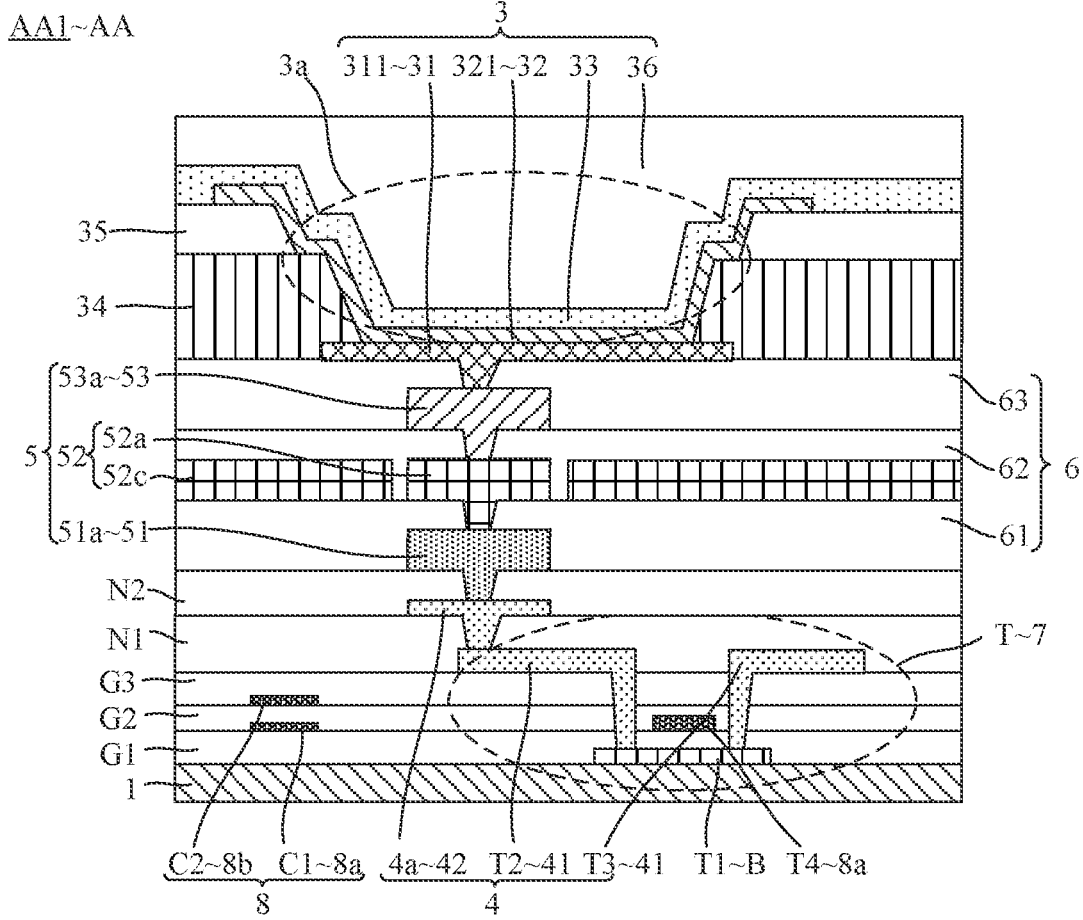
FIG. 11B is a sectional view of a first display region of another display substrate, in accordance with some embodiments.
Figure 15:
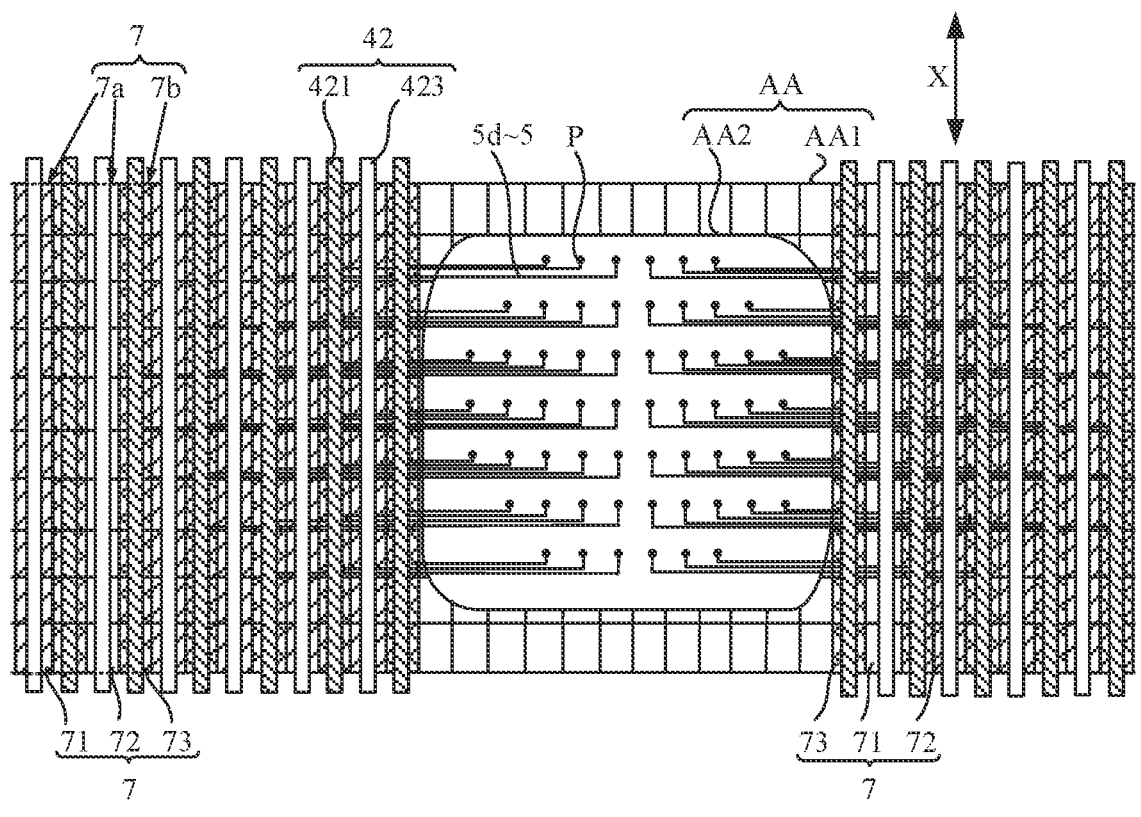
FIG. 15 is an enlarged view of a structure of a second display region and a surrounding region thereof, in accordance with some embodiments.

FIGS. 8, 11A and 11B are each a sectional view of a structure of a first display region AA1 of the display substrate 10. FIG. 10 is an enlarged structural view of the transparent conductive layer and the anode layer in the first display region AA1 of the display substrate 10. FIGS. 9A and 9B are each a sectional view of a structure of a second display region AA2 of the display substrate 10. FIG. 15 is an enlarged view of the second display region and a surrounding region of the display substrate 10 shown in FIG. 6.

Figure 14A:
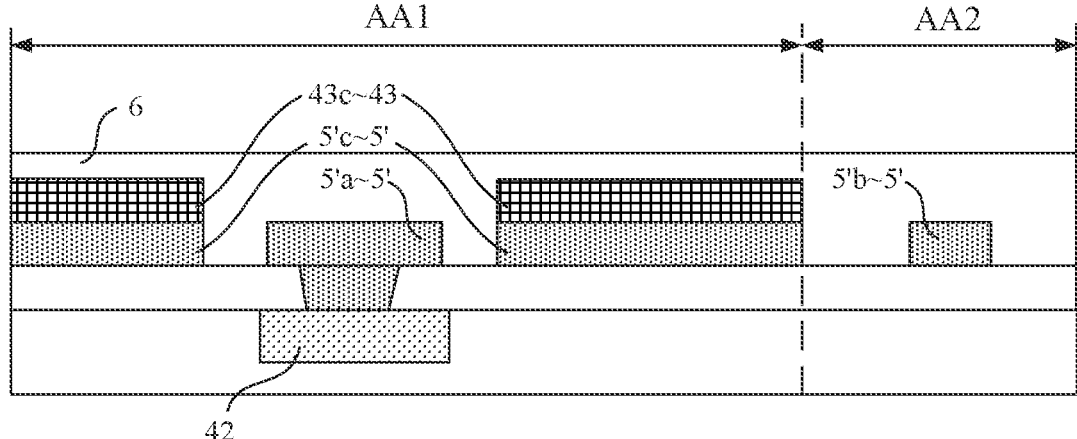
FIG. 14A is a sectional view of an additional metal layer, in accordance with some embodiments.
Figure 14B:
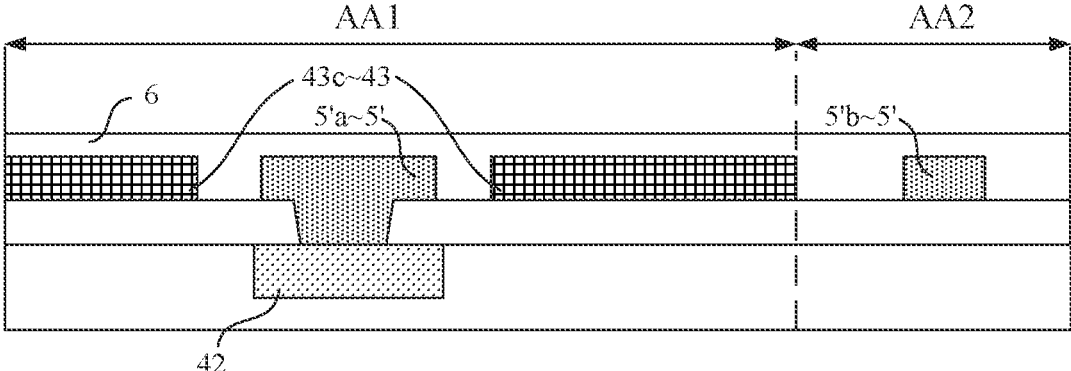
FIG. 14B is a sectional view of another additional metal layer, in accordance with some embodiments.
Figure 16:
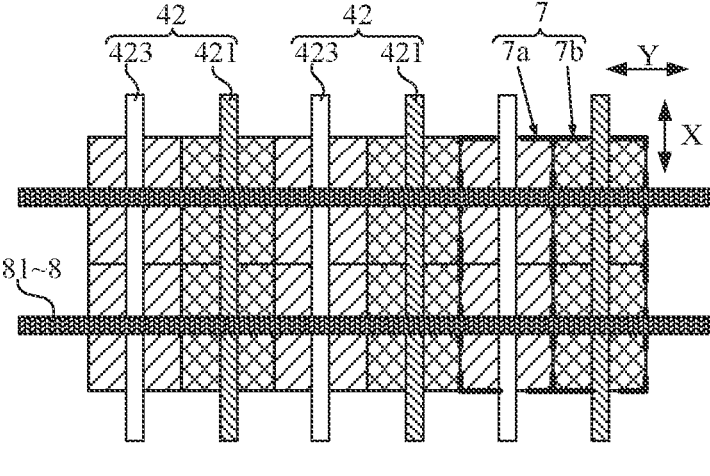
FIG. 16 is a structural diagram of a second source-drain conductive layer, in accordance with some embodiments.
Figure 17:
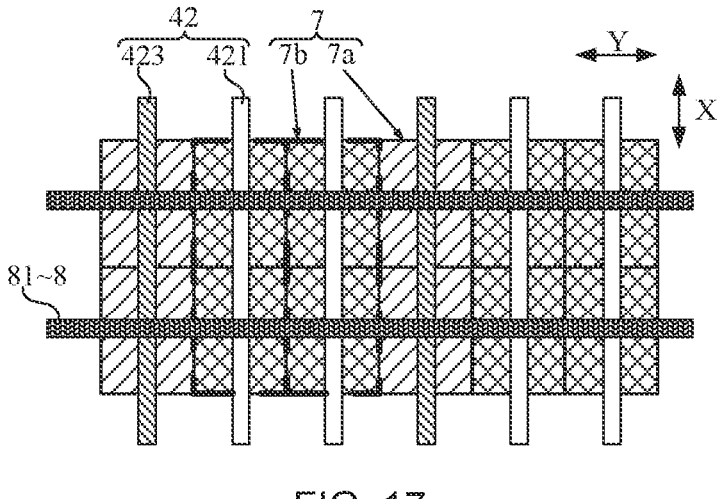
FIG. 17 is a structural diagram of another second source-drain conductive layer, in accordance with some embodiments.
Figure 18:
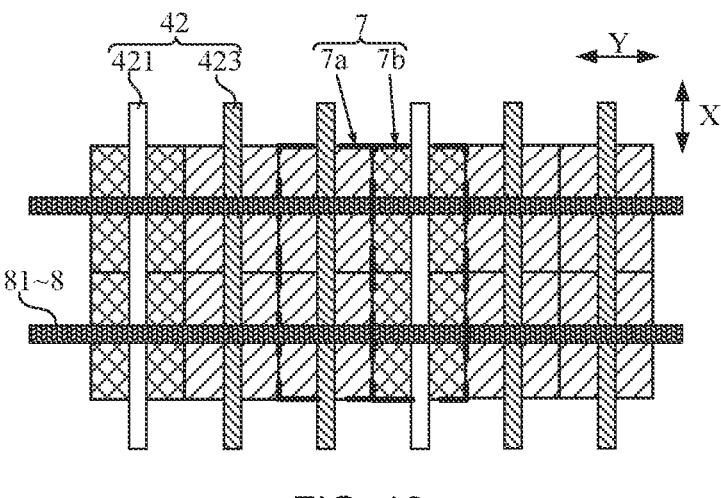
FIG. 18 is a structural diagram of yet another second source-drain conductive layer, in accordance with some embodiments.
Figure 20A:
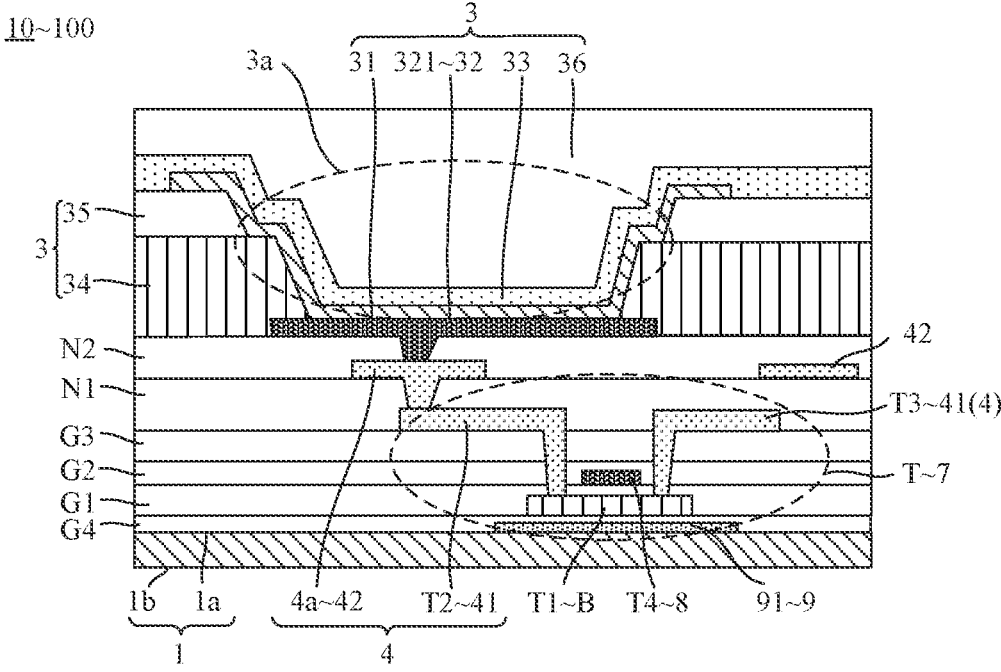
FIG. 20A is a sectional view of a light-shielding layer, in accordance with some embodiments.
Figure 20B:
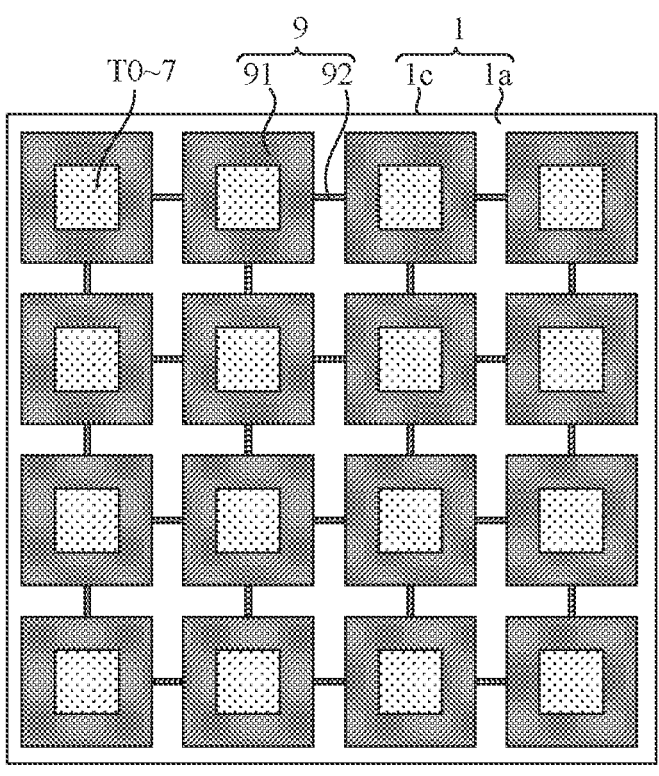
FIG. 20B is a plan view of a structure of a light-shielding layer, in accordance with some embodiments.
Figure 21:
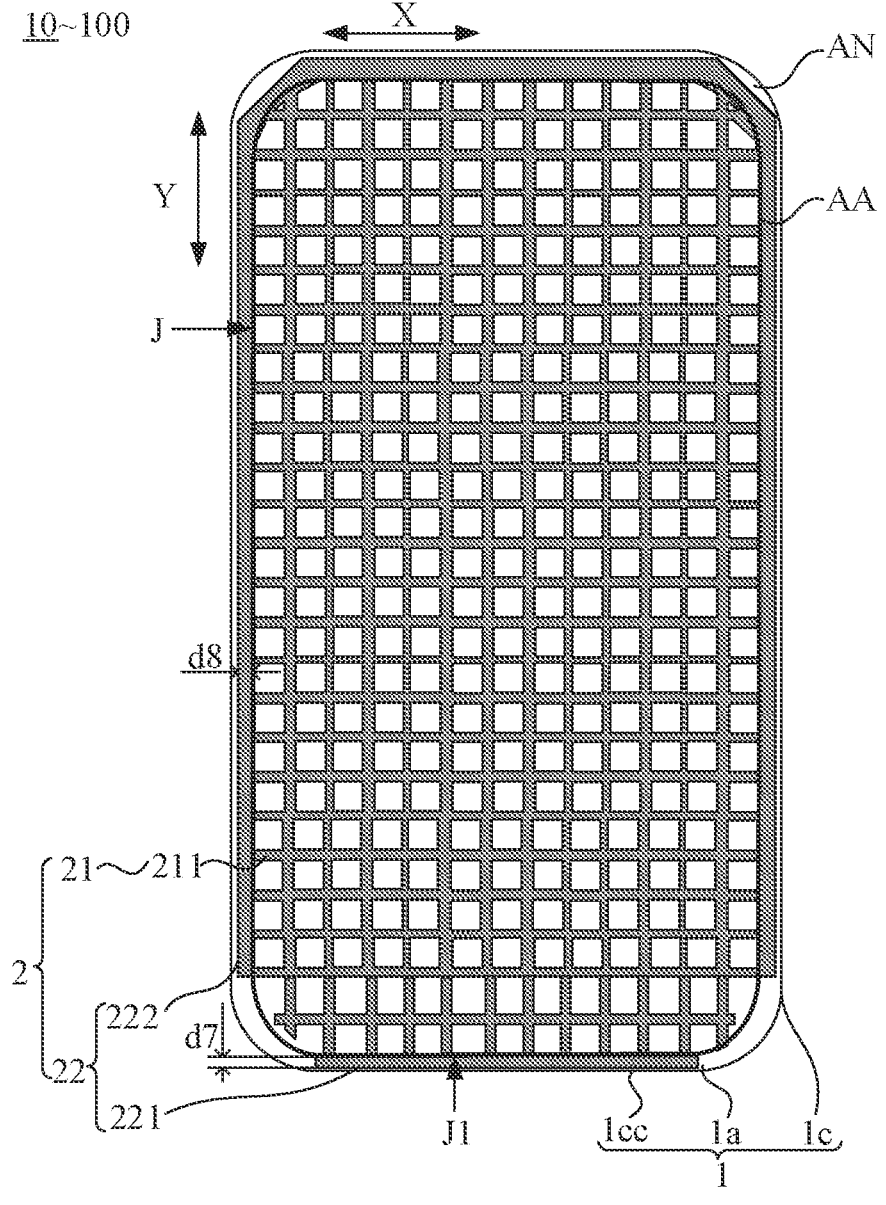
FIG. 21 is a structural diagram of a first voltage signal bus, in accordance with some embodiments.

FIGS. 14A and 14B are each a sectional view of an additional metal layer of the display substrate 10. FIGS. 16 to 18 are each a structural diagram of a second source-drain conductive layer 42 of the display substrate 10. FIGS. 20A and 20B are each a structural diagram of a light-shielding layer of the display substrate 10. FIG. 21 is a structural diagram of a first voltage signal bus of the display substrate 10.

The sign "A~B" in the reference signs means that A belongs to B. For example, the sign "61~6" indicates that a first planarization layer 61 belongs to the planarization layer(s) 6. It can be understood that, in some embodiments, the planarization layer(s) 6 only include the first planarization layer 61. In some other embodiments, the planarization layer(s) 6 include the first planarization layer 61, and other film layer structures such as a second planarization layer 62 and a third planarization layer 63.

In the following, a surface of the display substrate 10 on which the light-emitting device layer 3 is provided is taken as a front surface of the display substrate 10. For example, the light-emitting device layer 3 is disposed on a first surface 1a of the substrate 1, the first surface 1a of the substrate 1 is the front surface (a display surface) of the display substrate 10, and correspondingly, a second surface 1b of the substrate 1 is a back surface (a non-display surface) of the display substrate 10.

Figure 5:
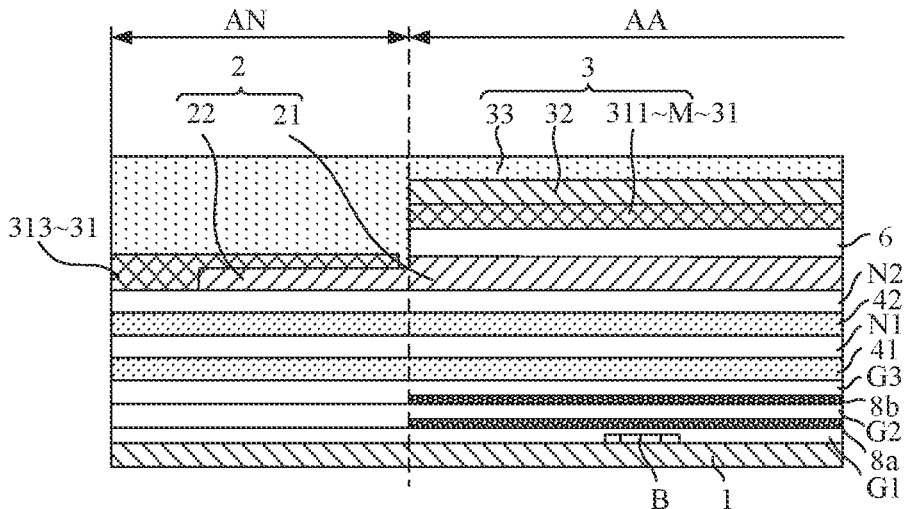
FIG. 5 is a sectional view of a structure of film layers in a peripheral region of a display substrate, in accordance with some embodiments.

In some embodiments, a display substrate 10 is provided. As shown in FIGS. 3 and 5, the display substrate 10 includes a display region AA and a peripheral region AN surrounding the display region AA. The display substrate 10 includes a substrate 1, a first voltage signal transmission structure 2 and a light-emitting device layer 3 that are sequentially arranged. The light-emitting device layer 3 includes an anode layer 31 and a cathode layer 33, and the anode layer 31 is closer to the substrate 1 than the cathode layer 33. The first voltage signal transmission structure 2 includes a first portion 21 located in the display region AA and a second portion 22 located in the peripheral region AN. The first portion 21 of the first voltage signal transmission structure 2 and the second portion 22 of the first voltage signal transmission structure 2 are electrically connected. The first voltage signal transmission structure 2 is configured to transmit a first voltage signal (a Vss signal) to the cathode layer 33.

The first voltage signal transmission structure 2 includes the first portion 21 disposed in the display region AA and the second portion 22 disposed in the peripheral region AN, and the first portion 21 and the second portion 22 of the first voltage signal transmission structure 2 are electrically connected together to transmit the first voltage signal (the Vss signal) to the cathode layer 33 of the light-emitting device layer 3. In this way, compared with the case that the first voltage signal transmission line VSS is only provided in the peripheral region in FIG. 1, since the first voltage signal transmission structure 2 further includes the first portion 21 located in the display region AA, an overall area of the first voltage signal transmission structure 2 increases, and a resistance of the first voltage signal transmission structure 2 may be greatly reduced. Accordingly, a dimension of the second portion 22 located in the peripheral region (e.g., a dimension e3 shown in FIG. 3) may be appropriately reduced. For example, the dimension e3 in FIG. 3 is smaller than the dimension e1 in FIG. 1. Therefore, an area of a region occupied by the first voltage signal transmission structure 2 in the peripheral region AN may be reduced, thereby narrowing the bezel of the display substrate. For example, a dimension e4 shown in FIG. 3 is reduced, and the dimension e4 shown in FIG. 3 is smaller than the dimension e2 in FIG. 1, thereby increasing the proportion of the area of the display region AA to the area of the display surface.

In addition, the first voltage signal transmission structure 2 includes the first portion 21 located in the display region AA and the second portion 22 located in the peripheral region AN, so that the first voltage signal (the Vss signal) may be input to the cathode layer 33 from the display region AA in addition to from the peripheral region AN. Compared with only introducing the first voltage signal (the Vss signal) from the peripheral region AN, the resistance of the first voltage signal transmission structure 2 may be greatly reduced, so that the voltage drop of the first voltage signal (the Vss signal) may be reduced. Further, the attenuation of the first voltage signal (the Vss signal) caused by the voltage drop may be effectively reduced, a difference in display effect between a middle and a periphery of the display substrate may be reduced, and the power consumption of the display substrate 10 may be reduced.

The light-emitting device layer 3 is configured to receive the first voltage signal (the Vss signal) to the cathode layer 33 thereof. When the anode layer 31 of the light-emitting device layer 3 receives the driving signal provided by the pixel circuit 7, the light-emitting device layer 3 emits light according to the received first voltage signal (the Vss signal) and the driving signal. When the cathode layer 33 of the light-emitting device layer 3 receives the first voltage signal (the Vss signal), the cathode layer 33 receives the first voltage, and the pixel circuit 7 receives the second voltage signal (the Vdd signal) and generates the driving signal according to the second voltage signal (the Vdd signal) and a data signal. The stability of the first voltage signal (the Vss signal) may affect the stability of the first voltage received by the cathode layer 33. The first portion 21 and the second portion 22 of the first voltage signal transmission structure 2 jointly transmit the first voltage signal (the Vss signal) to the cathode layer 33. Therefore, the voltage drop of the first voltage signal (the Vss signal) may be effectively reduced, the stability of the first voltage may be improved, and the voltage difference between the first voltage and the second voltage in the display substrate may further be reduced, thereby further reducing the power consumption of the display substrate.

For example, the substrate 1 includes a first surface 1a and a second surface 1b that are opposite, and a plurality of side surfaces 1c each connecting the first surface 1a and the second surface 1b.

In some examples, the shapes of the first surface 1a and the second surface 1b of the substrate 1 are rectangular, and the substrate 1 includes four side surfaces 1c.

Further, as shown in FIG. 3, the four corners of the substrate 1 are each in a shape of an arc.

In some examples, a material of the substrate 1 is a rigid material such as glass, quartz, or plastic.

In some other examples, the material of the substrate 1 is a flexible material such as a flexible printed circuit board (FPC) or a polyimide (PI) base film.

In some embodiments, as shown in FIGS. 3 and 4, the first portion 21 of the first voltage signal transmission structure 2 includes a pattern in a mesh structure.

For example, as shown in FIG. 3, the first portion 21 of the first voltage signal transmission structure 2 includes a plurality of mesh holes K2. The first portion 21 of the first voltage signal transmission structure 2 is, for example, a film structure with a plurality of mesh holes K2 arranged in an array in a whole-layer film structure, which are formed by removing a plurality of redundant portions arranged in an array from the whole-layer film structure. It can be understood that the first portion 21 of the first signal transmission structure 2 obtained in such a way is a film layer structure in a mesh.

In some other embodiments, as shown in FIGS. 16, 17 and 18, the first portion 21 of the first voltage signal transmission structure 2 includes a plurality of first voltage signal lines 421 extending in the same direction.

In yet some other examples, the first portion 21 of the first voltage signal transmission structure 2 includes a pattern in a mesh structure, and the first portion 21 of the first voltage signal transmission structure 2 further includes a plurality of first voltage signal lines 421 extending in the same direction.

For example, the first portion 21 of the first voltage signal transmission structure 2 is a laminated film structure. Further, the first portion 21 of the first voltage signal transmission structure 2 includes, for example, a first conductive layer and a second conductive layer, and the first conductive layer and the second conductive layer are electrically connected. The first conductive layer includes multiple first voltage signal lines 421 extending in a first direction X, the second conductive layer includes multiple first voltage signal lines 421 extending in a second direction Y, and the first direction X is perpendicular to the second direction Y. The multiple first voltage signal lines 421 extending in the first direction X and the multiple first voltage signal lines extending in the second direction Y form a crossing network structure.

In some examples, the first conductive layer is the first source-drain conductive layer 41, and the second conductive layer is the second source-drain conductive layer 42.

The first portion 21 of the first voltage signal transmission structure 2 is arranged in the display region AA, and is configured to transmit the first voltage signal (the Vss signal) to the cathode layer 33 of the light-emitting device layer 3. Whether the first portion 21 of the first voltage signal transmission structure 2 is provided to be in a mesh structure or is provided to include the plurality of first voltage signal lines 421 extending in the same direction, compared to the case shown in FIG. 1 that only the first voltage signal transmission line VSS is provided in the peripheral region AN for transmitting the first voltage signal (the Vss signal), an area of the wiring for transmitting the first voltage signal (the Vss signal) may increase. It can be understood that the resistance of the wiring for transmitting the first voltage signal (the Vss signal) may decrease, so that the voltage drop of the first voltage signal (the Vss signal) may decrease, thereby effectively reducing the attenuation of the first voltage signal (the Vss signal) caused by the voltage drop, and reducing the difference in display effect between the middle and the periphery of the display substrate. Further, adopting such a design may make the transmission of the first voltage signal (the Vss signal) stable, so as to ensure a small voltage difference between the first voltage and the second voltage that are applied to the light-emitting device layer 3, thereby reducing the power consumption of the display substrate.

In some embodiments, as shown in FIG. 3, a boundary of the display region AA of the display substrate 10 includes a plurality of boundary lines J, and a boundary line J in the plurality of boundary lines J is a selected boundary line J1. The second portion 22 of the first voltage signal transmission structure 2 includes a first bus 221 and a second bus 222. The first bus 221 extends in an extension direction of the selected boundary line J1 and is configured to receive the first voltage signal (the Vss signal) provided by an external chip. The second bus 222 is disposed on a periphery of remaining boundary lines J, except for the selected boundary line J1, in the plurality of boundary lines J. An orthographic projection of the second bus 222 on the substrate 1 and an orthographic projection of the first bus 221 on the substrate 1 have no overlap.

As shown in FIG. 3, the first bus 221 is disposed proximate to the selected boundary line J1 of the display region AA. In the plurality of side surfaces 1c of the substrate 1, a side surface proximate to the selected boundary line J1 of the display region AA is a selected side surface 1cc.

The selected boundary line J1 of the display region AA extends in the first direction X. It can be understood that the first bus 221 extends in the first direction X. Two adjacent side surfaces 1c of the substrate 1 form a corner. The following will be described by considering an example where the substrate 1 has a rectangular shape. In this case, the substrate 1 includes four corners.

The orthographic projection of the second bus 222 on the substrate 1 does not overlap with the orthographic projection of the first bus 221 on the substrate 1. It can be understood that positions to which two corners formed by the selected side surface 1cc of the substrate 1 and two side surfaces 1c respectively adjacent thereto are proximate are not provided with the first bus 221 and the second bus 222. That is, each of positions of the two corners of the substrate 1 does not provided with a connecting line for transmitting the first voltage signal (the Vss signal). Therefore, a dimension, in a direction perpendicular to a boundary line J of the display region AA, of a part of the peripheral region AN located in a region where each of the two corners is proximate to is reduced, and the edge of the display region AA is an edge to which the part of the peripheral region AN is proximate. Therefore, the width of the bezel of the display substrate 10 at each of the two corners may be effectively reduced.

In some embodiments, the first portion 21 of the first voltage signal transmission structure 2 is connected to the second bus 222. As shown in FIG. 4, the first voltage signal transmission structure 2 further includes a plurality of connecting lines 23, and the first portion 21 of the first voltage signal transmission structure 2 is connected to the first bus 221 through the plurality of connecting lines 23.

As shown in FIG. 4, a gap K1 is formed between two adjacent connecting lines 23, the first portion 21 of the first voltage signal transmission structure 2 and the first bus 221. Compared to a connection structure, using a whole-layer film structure, between the first portion 21 of the voltage signal transmission structure 2 and the first bus 221, the plurality of connecting lines 23 are used as the connection structure, and the formed gap K1 may be used as an air vent, so that the film layer exposed by the gaps K1 may perform heat dissipation well, thereby effectively alleviating an increase in energy consumption of the display substrate 10 caused by rapid temperature rise due to poor heat dissipation between the film layer structures.

In some embodiments, as shown in FIG. 5, the display substrate 10 further includes a source-drain conductive layer 4, and the source-drain conductive layer 4 includes a first source-drain conductive layer 41 disposed on a side of the substrate 1, and a second source-drain conductive layer 42 disposed on a side of the first source-drain conductive layer 41 away from the substrate 1. The first voltage signal transmission structure 2 is located between the second source-drain conductive layer 42 and the anode layer 31. That is, other conductive film layers are included between the second source-drain conductive layer 42 and the anode layer 31, and the first voltage signal transmission structure 2 is located in the aforementioned other conductive film layers. The anode layer 31 includes a plurality of anodes M located in the display region AA and an overlapping anode 313 located in the peripheral region AN, and the overlapping anode 313 is electrically insulated from the plurality of anodes M. The second portion 22 of the first voltage signal transmission structure 2 is electrically connected to the cathode layer 33 by the overlapping anode 313.

Referring to the descriptions for the overlapping anode 313 in FIG. 2 and for the connection between the overlapping anode 313 and the first voltage signal transmission line VSS, in other embodiments of the present disclosure, as shown in FIG. 5, the second portion 22 of the first voltage signal transmission structure 2 located the peripheral region is electrically connected to the overlapping anode 313 located in the peripheral region AN, and the overlapping anode 313 is electrically connected to the cathode layer 33, thereby transmitting the first voltage signal (the Vss signal) transmitted by the first voltage signal transmission structure 2 to the cathode layer 33.

In some embodiments, as shown in FIGS. 5 and 8, the display substrate 10 further includes transparent conductive film layer(s) located between the second source-drain conductive layer 42 and the anode layer 31. For example, the transparent conductive film layer(s) is an ITO layer, The first voltage signal transmission structure 2 is formed in the transparent conductive film layer(s) and distributed in the display region AA and the peripheral region AN.

For example, the first portion 21 of the first voltage signal transmission structure 2 is made of a transparent conductive material. Further, the first voltage signal transmission structure 2 is, for example, made of ITO, or polymer (PEDOT) of 3,4-ethylenedioxythiophene (EDOT) monomer. Furthermore, the second portion 22 of the first voltage signal transmission structure 2 is also made of a transparent conductive material.

In some embodiments, in addition to the display substrate, the display apparatus may further include electrical components such as sensors, for example, optical sensors. Considering an example of the display apparatus being a mobile phone, the display apparatus includes optical sensors such as a front camera, a proximity light sensor, and a 3-dimensional (3D) sensing module. These optical components need to receive light from a side of the display surface of the display apparatus to achieve corresponding functions. In the display apparatus, the optical sensors are usually installed on a side of the non-display surface of the display substrate, and photosensitive surfaces of the optical sensors face the display substrate. A full display with camera (FDC) uses an under-screen camera technology to hide the camera and other sensors directly below the screen, so as to achieve full-screen display. Based on the full-screen display, several specific implementations in which the first voltage signal transmission structure 2 is distributed in the display region AA are introduced in the embodiments of the present disclosure.

As shown in FIGS. 6 and 7, the display region AA includes a first display region AA1 and a second display region AA2, and the first display region AA1 surrounds the second display region AA2. The second display region AA2 is, for example, a circular region or a square region.

For example, the first display region AA1 is a normal display region, that is, the first display region AA1 is provided with sub-pixels P arranged in an array, and each sub-pixel P includes a pixel circuit 7 and a light-emitting device 3a. The second display region AA2 is a transparent display region, and the region may also display, but has a high light transmittance. Sensors, such as the camera, the proximity light sensor, the 3D sensing module, and other optical sensors, are provided on a side of the substrate 1 away from the driving circuit layer, and a projection of each of the sensors on the substrate 1 is located in the second display region AA2. The photosensitive surfaces of the optical sensors face the side of the display surface of the display apparatus, and are each used for receiving ambient light from the side of the display surface of the display apparatus. For example, the second display region AA2 is provided with sub-pixels P arranged in an array. For convenience of illustration, each sub-pixel P in FIG. 7 is presented as a miniature black dot. Each sub-pixel P in the second display region AA2 only includes a light-emitting device, and a pixel circuit 7 corresponding to each light-emitting device is distributed in the first display region AA1. Since the transistors included in the pixel circuit 7 are all made of opaque metal materials, the pixel circuits 7 of the sub-pixels P in the second display region AA2 are disposed in the first display region AA1, and the film layer material of the second display region AA2 adopts a material with the high light transmittance. As a result, the light transmittance of the second display region AA2 may be improved.

As shown in FIG. 7, the display substrate 10 includes a plurality of pixel circuits 7 arranged on the side of the substrate 1 and located in the first display region AA1. The plurality of pixel circuits 7 include first pixel circuits 71 for controlling light-emitting devices in the sub-pixels P located in the first display region AA1 and second pixel circuits 72 for controlling light-emitting devices in sub-pixels P located in the second display region AA2.

The plurality of pixel circuits 7 are located in the first display region AA1 and not located in the second display region AA2. For example, a plurality of second pixel circuits 72 are distributed in gaps between a plurality of first pixel circuits 71.

The plurality of anodes M includes a plurality of first anodes 311 located in the first display region AA1, and a plurality of second anodes 312 located in the second display region AA2. Each first pixel circuit 71 is electrically connected to a first anode 311 to control a light-emitting device 3a connected to the first anode 311 to emit light, and each second pixel circuit 72 is electrically connected to a second anode 312 to control a light-emitting device 3a connected to the second anode 312 to emit light. The second anode 312 is located in the second display region AA2, and the second pixel circuit 72 is located in the first display region AA1. In this way, a connecting wire is required to connect the second anode 312 and the second pixel circuit 72. In order to ensure reasonable wiring to avoid short circuit, and to ensure the high light transmittance of the second display region AA2, the transparent conductive film layer(s) are added between the second source-drain conductive layer 42 and the anode layer 31, and are used for arranging connecting wires 5d.

For example, as shown in FIG. 8, the display substrate 10 further includes at least one transparent conductive layer 5 disposed on a side of the second source-drain conductive layer 42 away from the substrate 1.

For example, the transparent conductive layer 5 is made of transparent conductive material. Further, the transparent conductive layer 5 may, for example, be made of ITO or polymer (PEDOT) of 3,4-ethylenedioxythiophene (EDOT) monomer.

As shown in FIGS. 8, 9A, 9B and 10, the transparent conductive layer 5 includes a plurality of first transfer electrodes 5a located in the first display region AA1, a plurality of second transfer electrodes 5b located in the second display region AA2, and a plurality of connecting wires 5d crossing the first display region AA1 and the second display region AA2. Each first transfer electrode 5a is electrically connected to a first anode 311 in the anode layer 31, and each second transfer electrode 5b is electrically connected to a second anode 312 in the anode layer 31. As shown in FIG. 10, the first transfer electrode 5a is connected to both an anode M on an upper layer thereof and a pixel circuit on a lower layer thereof, such as a source or a drain of a transistor in the pixel circuit.

As shown in FIGS. 9A and 9B, the second transfer electrode 5b is connected to both an anode M on an upper layer thereof and a corresponding pixel circuit by a connecting wire 5d. One end of each connecting wire 5d is connected to a second transfer electrode 5b, and the other end thereof is connected to a source or a drain of a transistor in the pixel circuit. As shown in FIG. 9A, in a case where the at least one transparent conductive layer 5 includes three transparent conductive layers, the connection wire 5d corresponding to a second anode 312 may be located in any layer of the three transparent conductive layers 5.

As a possible design, the second display region AA2 is provided with a camera and other devices therein. The transparent conductive layer 5, instead of metal layer(s), is used to arranging the connecting wires 5*d*, so as to transmit control signals to the second display region AA2. The transparent conductive layer 5 has good light transmittance, so that the transparent conductive layer 5 may not only play a role of signal transmission, but also not block the camera and other devices arranged in the second display region AA2, thereby ensuring the normal operation of the display substrate 10.

It can be understood that, for a non-full-screen display, the above design may also be adopted. The present disclosure is described on a basis that the display apparatus is a full-screen display, but the type of the display apparatus is not limited thereto.

The above has introduced the application of the transparent conductive layer in the full-screen display, that is, the transfer electrodes and the connecting wires are arranged in the transparent conductive layer, so as to realize the control of the second anode in the second display region by the second pixel circuit. In the following, some arrangements of the first voltage signal transmission structure in the transparent conductive layer will be introduced.

Embodiments in which the first portion of the first voltage signal transmission structure includes the pattern in the mesh structure are introduced below.

Please refer to FIG. 10, which is a schematic diagram of patterns of the transparent conductive layer 5 and the anode layer 31 in a partial region of the first display region AA1. In some embodiments, the transparent conductive layer 5 further includes a first pattern 5*c* located at least in a region of the first display region AA1 except for a region where the plurality of first transfer electrodes 5*a* are located.

As shown in FIG. 10, a portion of the transparent conductive layer 5 located in the first display region AA1 includes the plurality of first transfer electrodes 5*a*. In addition to the plurality of first transfer electrodes 5*a*, the portion of the transparent conductive layer 5 located in the first display region AA1 further includes the first pattern 5*c*, and the first pattern 5*c* is not in contact with the plurality of first transfer electrodes 5*a*.

For example, as shown in FIG. 10, the first pattern Sc includes a plurality of mesh holes K2.

At least one transparent conductive layer in the at least one transparent conductive layer 5 is a selected transparent conductive layer, a first pattern of the selected transparent conductive layer is configured to transmit the first voltage signal (the Vss signal), and the first voltage signal transmission structure 2 includes the first pattern of the selected transparent conductive layer.

In a case where the display substrate only includes a single transparent conductive layer 5, the transparent conductive layer 5 is the selected transparent conductive layer; and in a case where the display substrate includes a plurality of transparent conductive layers 5, one or more of the transparent conductive layers 5, or all of the transparent conductive layers 5 are the selected transparent conductive layers.

Each transparent conductive layer 5 has the same structure, and the first pattern 5*c* of the transparent conductive layer 5 includes the plurality of mesh holes K2. It can be understood that the first pattern of the selected transparent conductive layer configured to transmit the first voltage signal (the Vss signal) also includes a plurality of mesh holes K2. In this case, a portion of the selected transparent conductive layer for transmitting the first voltage signal line (the Vss signal) has a mesh structure.

Compared to a whole-layer film structure, the plurality of mesh holes K2 included in the first pattern 5*c* may be used as air vents, so that the film layer exposed by the plurality of mesh holes K2 may perform heat dissipation well, thereby effectively alleviating an increase in energy consumption of the display substrate 10 caused by rapid temperature rise due to poor heat dissipation between the film layer structures.

Further, the first pattern 5*c* is provided in the transparent conductive layer 5 as a portion of the first voltage signal transmission structure 2. Compared to a case that the transparent conductive layer 5 is only provided in the second display region AA2 to achieve signal transmission, the first pattern 5*c* is provided in the first display region AA1 for transmitting the first voltage signal (the Vss signal), that is, the transparent conductive layer 5 is further used to transmit the first voltage signal, so that the utilization rate of the transparent conductive layer 5 may be improved. In this way, there is no need to provide new film layer(s) used as the first voltage signal transmission structure 2. Therefore, film materials may be saved, the manufacturing process may be simplified, and the thickness of the display substrate may not increase.

In addition, compared with the case that the first voltage signal transmission line VSS is only provided in the peripheral region AN in FIG. 1, the first pattern, having the mesh structure, of the selected transparent conductive layer in the first display region AA1 is configured to transmit the first voltage signal (the Vss signal). Therefore, an overall area of a signal line for transmitting the first voltage signal (the Vss signal) increases, so that the resistance of the signal line for transmitting the first voltage signal (the Vss signal) may be reduced. Accordingly, a dimension of a portion of the signal line for transmitting the first voltage signal (the Vss signal) located in the peripheral region may be appropriately reduced, thereby reducing an area of a region occupied by the signal line for transmitting the first voltage signal (the Vss signal) in the peripheral region AN. As a result, the bezel of the display substrate may be narrowed, thereby increasing the proportion of an area of the display region AA to an area of the display surface.

It will be noted that the signal line for transmitting the first voltage signal (the Vss signal) refers to the first voltage signal transmission line VSS in some embodiments shown in FIG. 1, and refers to the first pattern of the selected transparent conductive layer configured to transmit the first voltage signal (the Vss signal) in other embodiments shown in FIG. 3.

Compared with a case that the plurality of second transfer electrodes 5*b* located in the second display region AA2 and the plurality of connecting wires 5*d* each for connecting the pixel circuit 7 and the anode M are only formed in the transparent conductive layer, the first pattern 5*c* is provided in the first display region AA1 to transmit the first voltage signal (the Vss signal), so that the utilization rate of the transparent conductive layer may be improved. Moreover, the total area of the signal line for transmitting the first voltage signal (the Vss signal) may increase, thereby improving the stability of the transmission of the first voltage signal (the Vss signal).

Figure 13A:
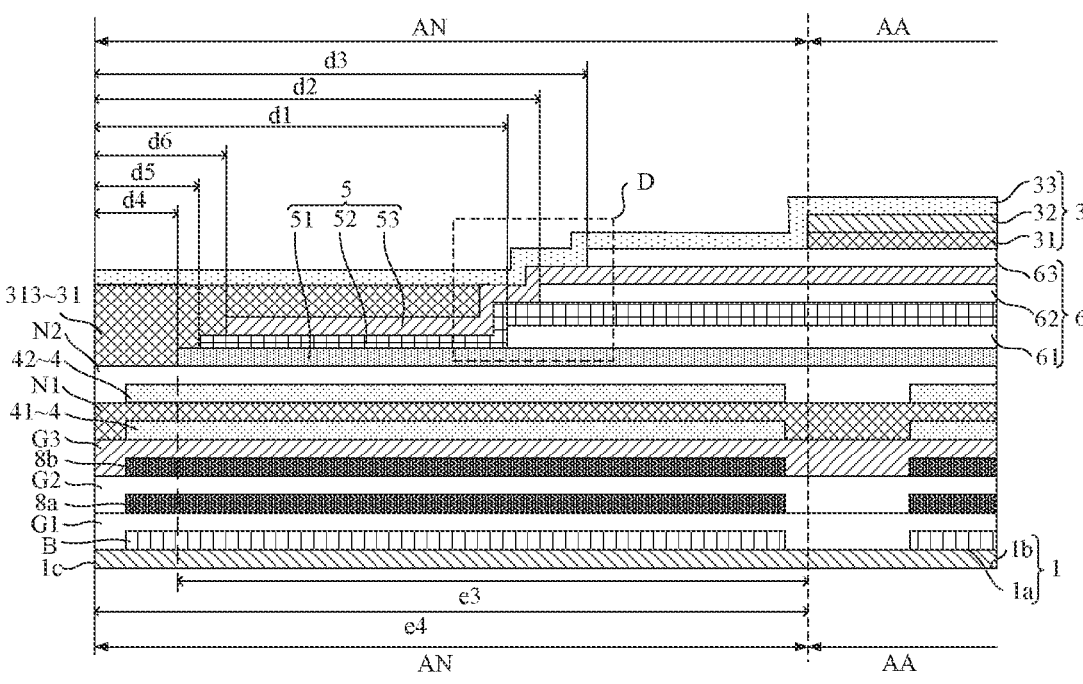
FIG. 13A is a sectional view of a structure of film layers in a peripheral region of another display substrate, in accordance with some embodiments.
Figure 13B:
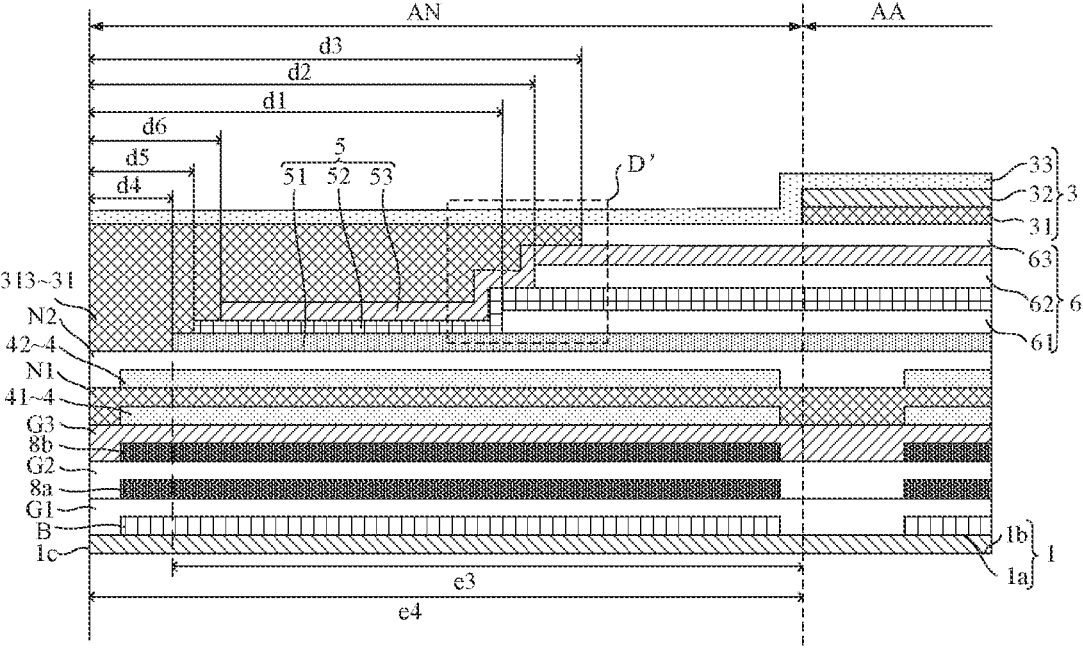
FIG. 13B is a sectional view of a structure of film layers in a peripheral region of yet another display substrate, in accordance with some embodiments.

In some embodiments, as shown in FIG. 11A, each transparent conductive layer in the at least one transparent conductive layer 5 is the selected transparent conductive layer. The first pattern of the selected transparent conductive layer is further located in the peripheral region AN, and a first pattern of each transparent conductive layer is used as the first voltage signal transmission structure 2. Portions of all of the at least one transparent conductive layer 5 located in the peripheral region AN are electrically connected. As shown in FIGS. 13A and 13B, a portion, located in the peripheral region AN, of a first pattern of a transparent conductive layer farthest away from the substrate 1 in the at least one conductive layer 5 is connected to the overlapping anode 313.

For example, the first pattern used as the first voltage signal transmission structure 2 has a whole-layer film structure covering the display region AA. In a direction perpendicular to the substrate 1, the first pattern used as the first voltage signal transmission structure 2 may cover the pixel circuit such as the driving transistor between the first pattern and the substrate 1. In this way, the influence of the pixel circuit on the coupling capacitance of the anode may be shielded.

The aforementioned term "cover" means that an orthographic projection of structures such as the driving transistor included in the pixel circuit on the substrate 1 is surrounded by an orthographic projection of the first pattern used as the first voltage signal transmission structure 2 on the substrate 1.

For example, as shown in FIG. 11A, the display substrate 10 includes three transparent conductive layers 5, and the three transparent conductive layers 5 include a first transparent conductive layer 51, a second transparent conductive layer 52, and a third transparent conductive layer 53 that are disposed sequentially from the substrate 1. Portions of the first transparent conductive layer 51, the second transparent conductive layer 52 and the third transparent conductive layer 53 located in the peripheral region AN are electrically connected, and a portion of the third transparent conductive layer 53 located in the peripheral region AN is connected to the overlapping anode 313.

In some embodiments, as shown in FIGS. 11A and 11B, the display substrate 10 further includes at least one planarization layer 6.

As shown in FIGS. 11A and 11B, the at least one transparent conductive layer 5 includes a first transparent conductive layer 51, a second transparent conductive layer 52, and a third transparent conductive layer 53 that are disposed sequentially from the substrate 1, and at least one planarization layer 6 includes a first planarization layer 61 located between the first transparent conductive layer 51 and the second transparent conductive layer 52, a second planarization layer 62 located between the second transparent conductive layer 52 and the third transparent conductive layer 53, and a third planarization layer 63 located on a side of the third transparent conductive layer 53 away from the substrate 1.

For example, a dimension, perpendicular to the substrate 1, of a portion of a planarization layer 6 located in the first display region AA1 is smaller than or equal to a dimension, perpendicular to the substrate 1, of a portion of the planarization layer 6 located in the second display region AA2.

In some examples, a dimension, perpendicular to the substrate 1, of a portion of a planarization layer 6 located in the first display region AA1 is equal to a dimension, perpendicular to the substrate 1, of a portion of the planarization layer 6 located in the second display region AA2.

In some other examples, a dimension, perpendicular to the substrate 1, of a portion of a planarization layer 6 located in the first display region AA1 is half of a dimension, perpendicular to the substrate 1, of a portion of the planarization layer 6 located in the second display region AA2.

In yet other examples, a dimension, perpendicular to the substrate 1, of a portion of a planarization layer 6 located in the first display region AA1 is zero, and a dimension, perpendicular to the substrate 1, of a portion of the planarization layer 6 located in the second display region AA2 is not zero.

In some embodiments, as shown in FIGS. 10 to 12A, the display substrate 10 includes a substrate 1, a semiconductor layer B, a first gate insulating layer G1, a first gate conductive layer 8a, a second gate insulating layer G2, a second gate conductive layer 8b, an interlayer insulating layer G3, a first source-drain conductive layer 41, a first insulating layer N1, a second source-drain conductive layer 42, a second insulating layer N2, a first transparent conductive layer 51, a first planarization layer 61, a second transparent conductive layer 52, a second planarization layer 62, a third transparent conductive layer 53 and a third planarization layer 63 that are arranged in sequence.

Figure 12B:
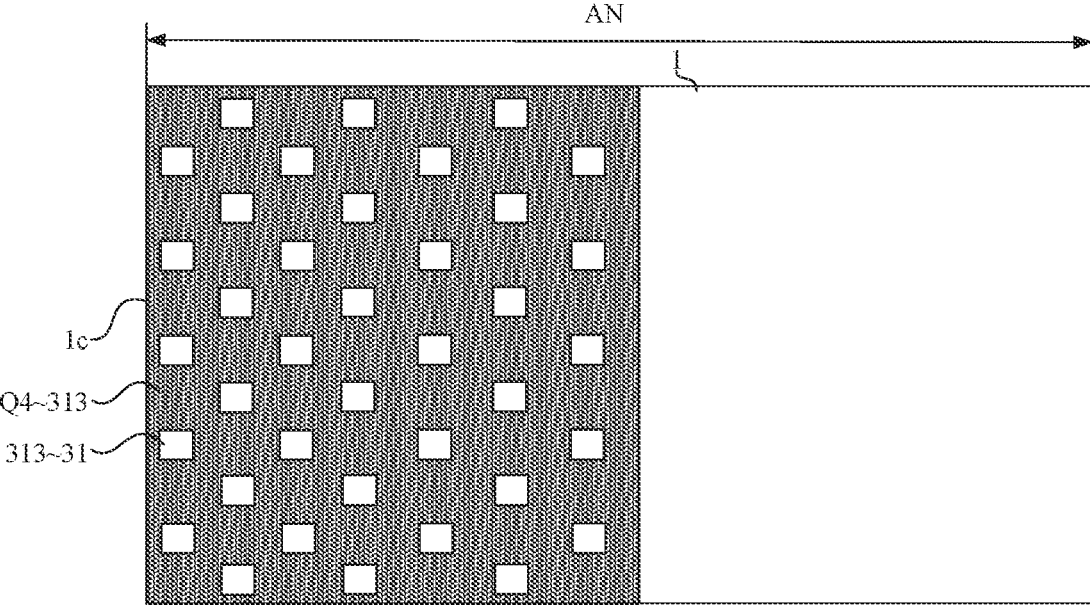
FIG. 12B is a structural diagram of an overlapping anode of a display substrate in a peripheral region, in accordance with some embodiments.

FIGS. 12A and 12B show enlarged views of a structure of the overlapping anode 313 in the peripheral region AN. The overlapping anode 313 is located in the peripheral region AN. In some examples, the overlapping anode 313 has a whole-layer film structure. In some other examples, the overlapping anode 313 includes a plurality of fourth openings Q4. In combination with FIG. 13A, it can be understood that the plurality of fourth openings Q4 expose a part of planarization layer(s) 6. The aforementioned planarization layer(s) 6 are, for example, the planarization layer 63 and/or the second planarization layer 62 and the first planarization layer 61. The plurality of fourth openings Q4 are, for example, used as air vents of the third planarization layer 63 and/or the second planarization layer 62 and the first planarization layer 61, thereby facilitating heat dissipation of the third planarization layer 63 and/or the second planarization layer 62 and the first planarization layer 61. Since the planarization layer 6 is made of an insulating material, the electrical connection between the overlapping anode 313 and the cathode layer 33 may not be affected.

Figure 12C:
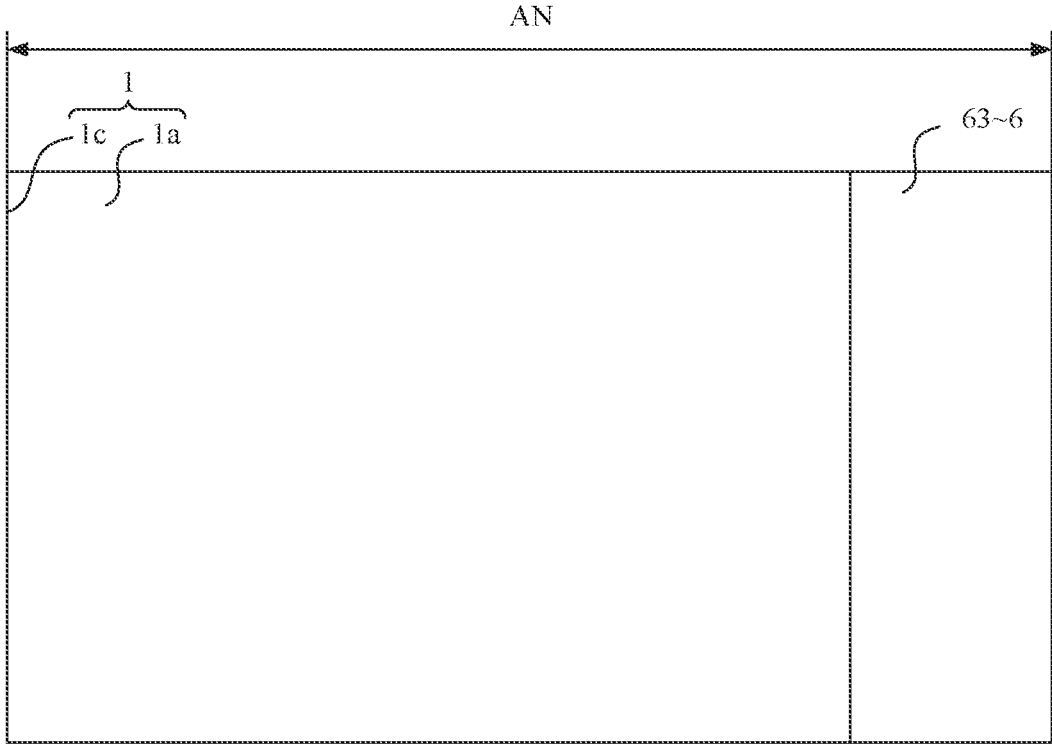
FIG. 12C is a structural diagram of a third planarization layer of a display substrate in a peripheral region, in accordance with some embodiments.

FIGS. 12A and 12C show enlarged views of a structure of the third planarization layer 63 in the peripheral region AN.

Figure 12D:
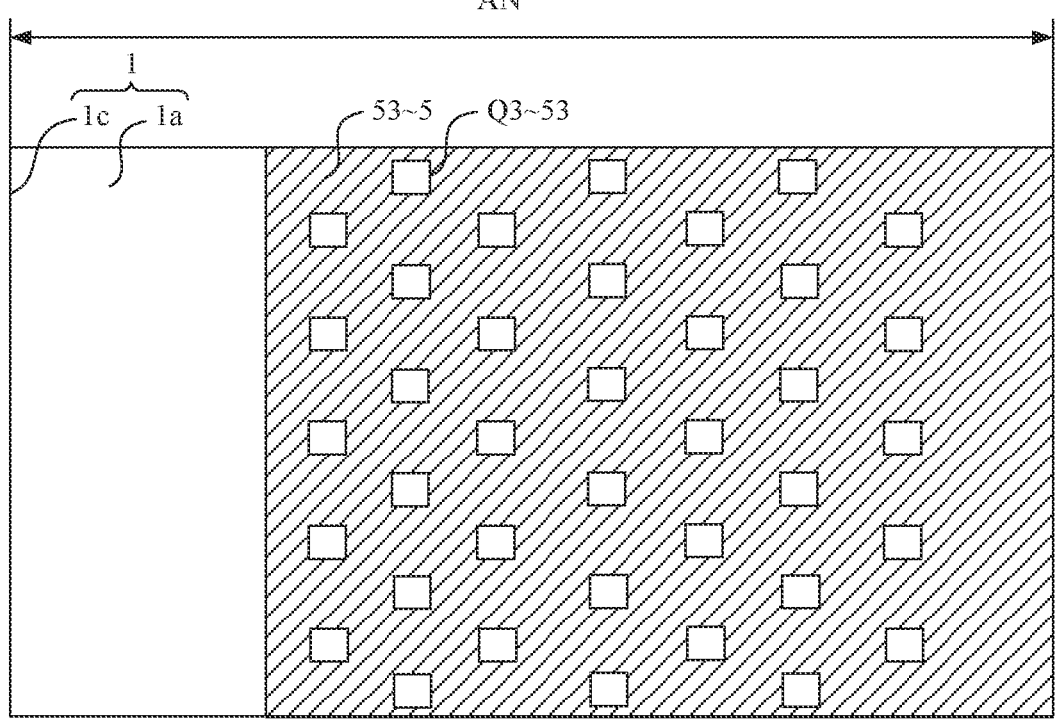
FIG. 12D is a structural diagram of a third transparent conductive layer of a display substrate in a peripheral region, in accordance with some embodiments.

FIGS. 12A and 12D show enlarged views of a structure of the third transparent conductive layer 53 in the peripheral region AN. For example, a border portion of the third transparent conductive layer 53 in the peripheral region AN further includes a plurality of third openings Q3. In combination with FIG. 13A, it can be understood that the plurality of third openings Q3 expose a part of the planarization layer(s) 6. The aforementioned planarization layer(s) 6 are, for example, the second planarization layer 62 and/or the first planarization layer 61. The plurality of third openings Q3 are, for example, used as air vents of the second planarization layer 62 and/or the first planarization layer 61, thereby facilitating heat dissipation of the second planarization layer 62 and/or the first planarization layer 61.

Figure 12E:
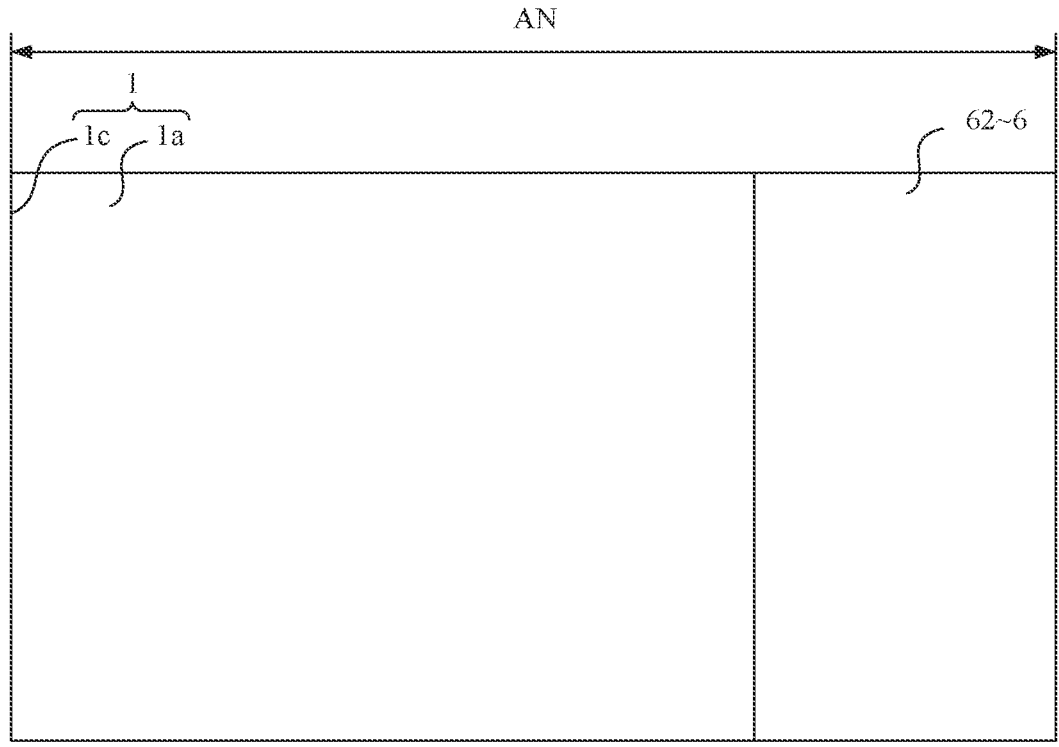
FIG. 12E is a structural diagram of a second planarization layer of a display substrate in a peripheral region, in accordance with some embodiments.

FIGS. 12A and 12E show enlarged views of a structure of the second planarization layer 62 in the peripheral region AN.

Figure 12F:
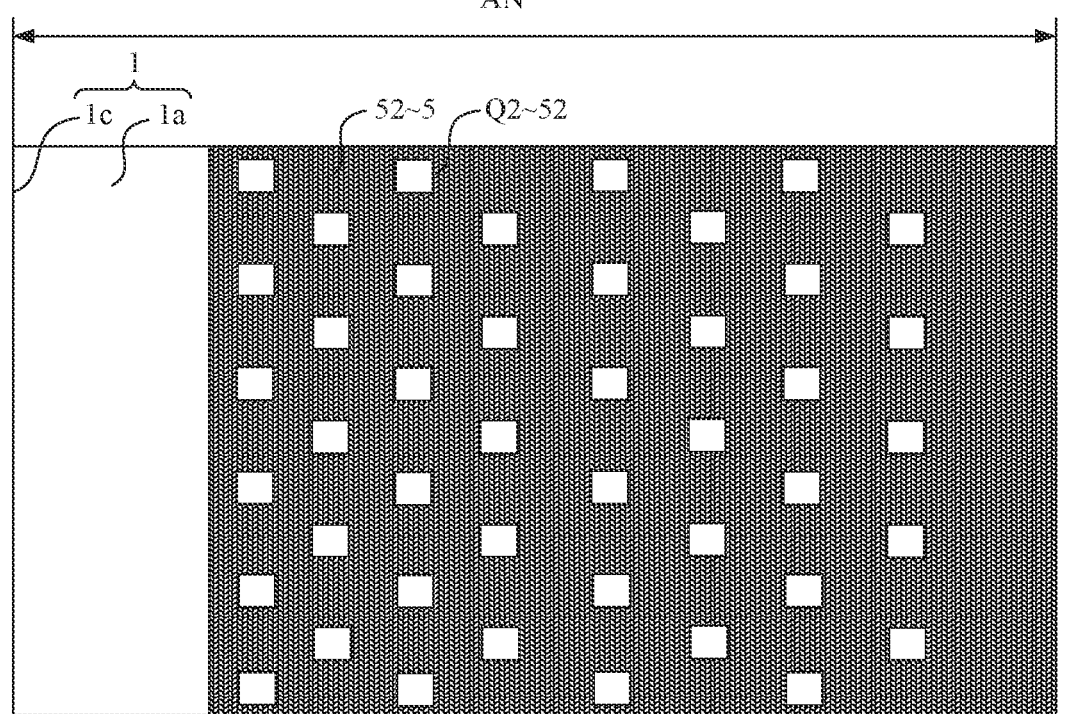
FIG. 12F is a structural diagram of a second transparent conductive layer of a display substrate in a peripheral region, in accordance with some embodiments.

FIGS. 12A and 12F show enlarged views of a structure of the second transparent conductive layer 52 in the peripheral region AN. For example, a border portion of the second transparent conductive layer 52 in the peripheral region AN further includes a plurality of second openings Q2. In combination with FIG. 13A, it can be understood that the plurality of second openings Q2 expose a part of the planarization layer(s) 6. The aforementioned planarization layer(s) 6 are, for example, the second planarization layer 62 and/or the first planarization layer 61. The plurality of third openings Q3 are, for example, used as air vents of the second planarization layer 62 and/or the first planarization layer 61, thereby facilitating heat dissipation of the second planarization layer 62 and/or the first planarization layer 61.

Figure 12G:
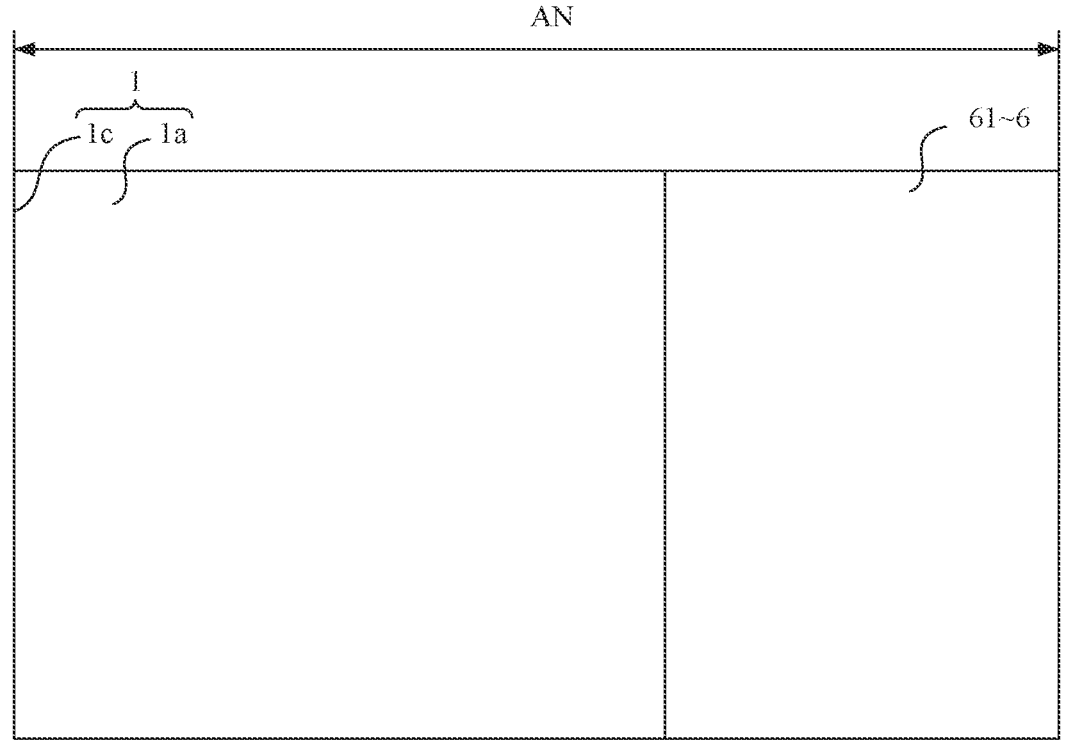
FIG. 12G is a structural diagram of a first planarization layer of a display substrate in a peripheral region, in accordance with some embodiments.

FIG. 12G shows an enlarged view of a structure of the first planarization layer 61 in the peripheral region AN.

Figure 12H:
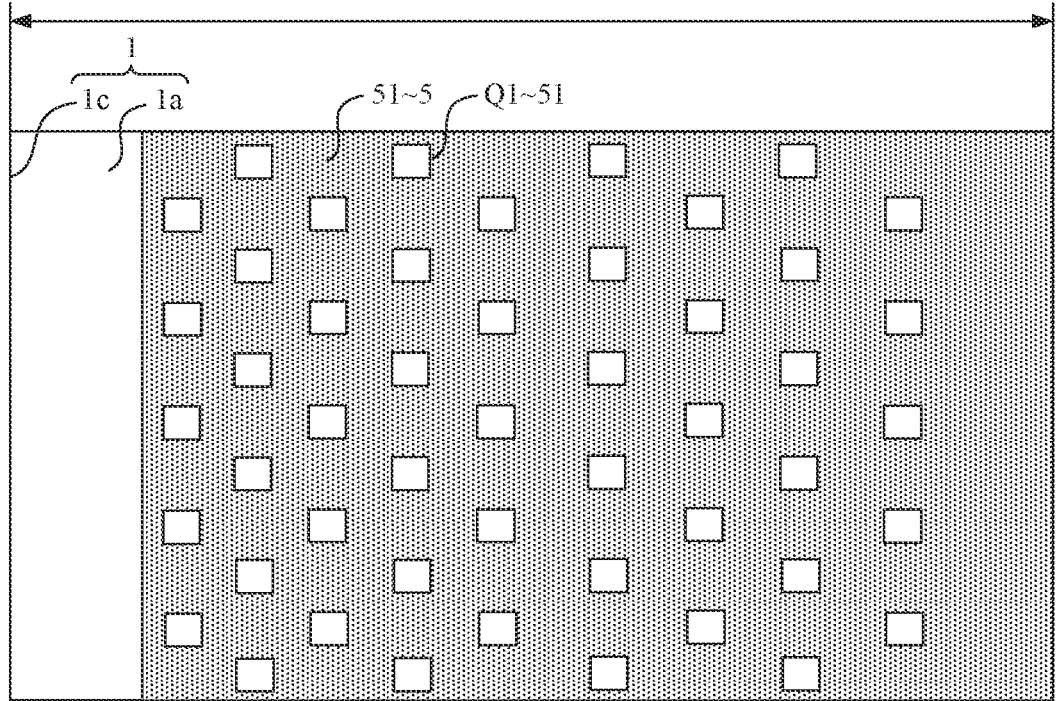
FIG. 12H is a structural diagram of a first transparent conductive layer of a display substrate in a peripheral region, in accordance with some embodiments.

FIG. 12H shows an enlarged view of a structure of the first transparent conductive layer 51 in the peripheral region AN. For example, a border portion of the first transparent conductive layer 51 in the peripheral region AN further includes a plurality of first openings Q1. In combination with FIG. 13A, it can be understood that the plurality of first openings Q1 expose a part of the planarization layer 6. The aforementioned planarization layer 6 is, for example, the first planarization layer 61. The plurality of first openings Q1 are, for example, used as air vents of the first planarization layer 61, thereby facilitating heat dissipation of the first planarization layer 61.

For the above structure, since the planarization layer 6 is made of an insulating material, the openings in the transparent conductive layer(s) 5, such as the first openings Q1 in the first transparent conductive layer 51, the second openings Q2 in the second transparent conductive layer 52, and the third openings Q3 in the third transparent conductive layer 53 may be used as the air vents of the planarization layer(s) 6, such as the first planarization layer 61, the second planarization layer 62, and the third planarization layer 63. In addition, the plurality of transparent conductive layers 5 will not be connected to one other through openings in the transparent conductive layers.

As shown in FIG. 13A, a distance d3 between an edge of the third planarization layer 63 and a side surface 1c of the substrate 1 is greater than a distance d2 between an edge of the second planarization layer 62 and the side surface 1c of the substrate 1, and the distance d2 between the edge of the second planarization layer 62 and the side surface 1c of the substrate 1 is greater than a distance d1 between an edge of the first planarization layer 61 and the side surface 1c of the substrate 1.

As shown in FIG. 13A, in a case where the display substrate 10 includes the plurality of transparent conductive layers 5 and a plurality of planarization layers 6, edges of the plurality of transparent conductive layers 5 and the plurality of planarization layers 6 have different distances from the side surface 1c of the substrate 1. It can be clearly seen from the sectional view of the display substrate 10 that, the cross-section of the edges of the plurality of transparent conductive layers 5 and the plurality of planarization layers 6 is in a stepped shape. With such a design, the thickness of the display substrate 10 in the direction perpendicular to the first surface 1a is gradually changed, thereby avoiding the step difference caused by the different thicknesses of the film layer structure, and further avoiding abnormal operation of display substrate 10 that is easily caused by the step difference.

It can be understood that, as shown in a region D of FIG. 13A, in order to clearly show the distance relationship between the edges of the transparent conductive layers 5 and the planarization layers 6 and the side surface 1c of the substrate 1 to which the edges is close, a cross-section of each planarization layer 6 in this figure at the edge of an adjacent transparent conductive layer 5 (as shown in the D region in FIG. 13A) is in a stepped shape. However, in actual production, the D region shown in FIG. 13A is a gentle slope with a continuous and gradual gradient. Such a design may effectively avoid fracture of the cathode layer 33 in this region caused by an excessively large step difference.

The following will be described by considering an example where the at least one transparent conductive layer 5 includes a first transparent conductive layer 51, a second transparent conductive layer 52 and a third transparent conductive layer 53, and the at least one planarization layer 6 includes a first planarization layer 61, a second planarization layer 62 and a third planarization layer 63.

In some embodiments, as shown in FIG. 13B, a surface of the overlapping anode 313 away from the substrate 1 is flush or substantially flush with a surface of the third planarization layer 63 away from the substrate 1.

In some other embodiments, the surface of the overlapping anode 313 away from the substrate 1 is flush or substantially flush with the surface of the second planarization layer 62 away from the substrate 1.

The aforementioned term "flush or substantially flush" means that the distance between the surface of the overlapping anode 313 away from the substrate 1 and the substrate 1 is the same or approximately the same as the distance between the surface of the third planarization layer 63 or the second planarization layer 62 away from the substrate 1 and the substrate 1.

The above positional relationship between the overlapping anode 313 and the transparent conductive layer(s) 5 and/or the planarization layer(s) 6 in the peripheral region AN is only described as an example, and is not intended to be as a limitation on the specific embodiments of the present disclosure.

For example, since the overlapping anode 313 is electrically insulated from the remaining part of the anode layer 31, the overlapping anode 313 and the plurality of anodes M included in the anode layer 31 are referred to as conductive patterns of the anode layer 31, and the overlapping anode 313 and the plurality of anodes M are independently separated conductive patterns. Therefore, when the display substrate 10 is manufactured, the following content is included.

In some embodiments, the conductive patterns included in the anode layer 31 are formed through a single process synchronously, and dimensions of the conductive patterns included in the anode layer 31 in a direction perpendicular to the substrate 1 are consistent. It can be understood that, in this case, the dimensions of the overlapping anode 313 and the remaining conductive patterns in the anode layer 31 in the direction perpendicular to the substrate 1 are consistent.

In some other embodiments, the conductive patterns included in the anode layer 31 are formed separately, for example, by two processes. The two processes are respectively used to form the overlapping anode 313 and the remaining conductive patterns in the anode layer 31. It can be understood that with such a design, in the direction perpendicular to the substrate 1, the dimension of the overlapping anode 313 may be inconsistent with the dimension of the remaining conductive patterns in the anode layer 31. Therefore, as shown in FIG. 13B, the surface of the overlapping anode 313 away from the substrate 1 is, for example, flush with the surface of the third planarization layer 63 away from the substrate 1. In this way, the dimension of the overlapping anode 313 in the direction perpendicular to the substrate 1 increases, so that there is no step difference in a region D' shown in FIG. 13B, and all portions of the cathode layer 33 in the peripheral region AN have the approximately consistent distances from the substrate 1, thereby effectively avoiding the risk of fracture of the cathode layer 33 in this region due to the existence of the step difference.

Further, as shown in FIG. 13B, the surface of the overlapping anode 313 away from the substrate 1 is, for example, flush with the surface of the third planarization layer 63 away from the substrate 1. In this case, the overlapping anode 313 fill in a region having the step difference at the edge position of the transparent conductive layer 5 and make the region leveled off. Therefore, the distances between the edges of the first transparent conductive layer 51, the second transparent conductive layer 52 and the third transparent conductive layer 53 and the side surface 1c of the substrate 1 may be the same, that is, d1, d2 and d3 may be the same.

For example, the cross-section of the edges of all film structures included in the display substrate 10 adopts a stepped-shape design. The description of "the cross-section of the edges of the film structures adopting the stepped-shape design" refers to that for any film structure such as a transparent conductive layer 5 in the display substrate 10, a surface of the transparent conductive layer 5 proximate to the substrate 1 is, for example, connected to the second insulating layer N2, and a surface of the transparent conductive layer 5 away from the substrate 1 is connected to a planarization layer 6; it can be understood that, from the substrate 1, the second insulating layer N2, the transparent conductive layer 5, and the planarization layer 6 are arranged in sequence and connected in sequence, distances between the side surface 1c of the substrate 1 and edges of the second insulating layer N2, the transparent conductive layer 5 and the planarization layer 6 are different from one another, and a distance between an edge of a film layer closest to the substrate 1 and the side surface 1c of the substrate 1 is the smallest, that is, a distance between an edge of the second insulating layer N2 and the side surface 1c of the substrate 1 is smaller than both a distance between an edge of the transparent conductive layer 5 and the side surface 1c of the substrate 1, and the distance between the edge of the transparent conductive layer 5 and the side surface 1c of the substrate 1 is smaller than a distance between an edge of the planarization layer 6 and the side surface 1c of the substrate 1. The second insulating layer N2, the transparent conductive layer 5, and the planarization layer 6 are considered as a whole structure, and the cross-section of the whole structure at the edge is in the stepped-shape.

For example, the distance between an edge of the at least one transparent conductive layer 5 and a side edge of the substrate 1 is smaller than the distance between an edge of the first planarization layer 61 and the side surface 1c of the display substrate 10.

As shown in FIG. 13A, a distance between an edge of the first transparent conductive layer 51 and the side surface 1c of the substrate 1 is d4, a distance between an edge of the second transparent conductive layer 52 and the side surface 1c of the substrate 1 is d5, a distance between an edge of the third transparent conductive layer 53 and the side surface 1c of the substrate 1 is d6, d4, d5, d6 are all smaller than d1, and d4, d5, d6 are all smaller than d2, and d4, d5, d6 are all smaller than d3.

For example, at least one of the first transparent conductive layer 51, the second transparent conductive layer 52, and the third transparent conductive layer 53 is the selected transparent conductive layer, and the first pattern of the selected transparent conductive layer is used as the first voltage signal transmission structure 2. A portion, located in the peripheral region AN, of the first pattern serving as the first voltage signal transmission structure 2 is connected to the overlapping anode 313.

In some examples, as shown in FIG. 13A, the first transparent conductive layer 51, the second transparent conductive layer 52, and the third transparent conductive layer 53 are all selected transparent conductive layers, the first patterns of the first transparent conductive layer 51, the second transparent conductive layer 52 and the third transparent conductive layer 53 are connected in the peripheral region AN, and a portion of the first pattern 53c of the third transparent conductive layer 53 located in the peripheral region AN is connected to the overlapping anode 313.

As shown in FIG. 11A, for example, the display substrate 10 includes three transparent conductive layers 5, and the three transparent conductive layers 5 include a first transparent conductive layer 51, a second transparent conductive layer 52, and a third transparent conductive layers 53 that are arranged sequentially. A first transfer electrode 51a of the first transparent conductive layer 51, a first transfer electrode 52a of the second transparent conductive layer 52, and a first transfer electrode 53a of the third transparent conductive layer 53 are sequentially connected as a whole, which serves as a first transfer electrode 5a. The first transfer electrode 5a is connected to the second signal line 4a in the source-drain conductive layer 4. In some examples, as shown in FIG. 11A, the first transfer electrode 5a is connected to the source T2 or the drain T3 of the thin film transistor T by the second signal line 4a.

For example, the display substrate 10 includes two transparent conductive layers 5, and the two transparent conductive layers 5 include a first transparent conductive layer 51 and a second transparent conductive layer 52 that are arranged sequentially from the substrate 1. A first transfer electrode 51a of the first transparent conductive layer 51 and a first transfer electrode 52a of the second transparent conductive layer 52 are sequentially connected as a whole, which serves as a first transfer electrode 5a. The first transfer electrode 5a is connected to the second signal line 4a in the source-drain conductive layer 4. In some examples, the first transfer electrode 5a is connected to the source T2 or the drain T3 of the thin film transistor T by the second signal line 4a.

For example, the display substrate 10 includes a single transparent conductive layer 5, and a first transfer electrode 5a of the transparent conductive layer 5 is connected to the second signal line 4a in the source-drain conductive layer 4. In some examples, as shown in FIG. 11A, the first transfer electrode 5a is connected to the source T2 or the drain T3 of the thin film transistor T by the second signal line 4a.

In some embodiments, as shown in FIGS. 11A, 11B, 12A and 13A, the at least one transparent conductive layer 5 includes a first transparent conductive layer 51, a second transparent conductive layer 52, and a third transparent conductive layer 53. A first pattern 52c of the second transparent conductive layer 52 is used as the first voltage signal transmission structure 2, and is configured to transmit the first voltage signal (the Vss signal) to the plurality of pixel circuits 7. The first pattern 52c of the second transparent conductive layer 52 is further located in the peripheral region AN, and a portion of the first pattern 52c of the second transparent conductive layer 52 located in the peripheral region is connected to the overlapping anode 313. A first pattern 51c of the first transparent conductive layer 51 and a first pattern 53c of the third transparent conductive layer 53 are configured to transmit the second voltage signal (the Vdd signal) to the plurality of pixel circuits 7.

The second voltage signal (the Vdd signal) is a constant voltage signal, which is more stable than the first voltage signal (the Vss signal). The second transparent conductive layer 52 is located between the first transparent conductive layer 51 and the third transparent conductive layer 53, so that the transmission of the first voltage signal (the Vss signal) is stable and not easily affected.

In some embodiments, as shown in FIG. 14A, the display substrate 10 further includes an additional metal layer 43 disposed on a side of the selected transparent conductive layer away from the substrate 1. The additional metal layer 43 includes a second pattern 43$c$. The second pattern 43$c$ of the additional metal layer 43 is arranged on a side of the first pattern 5'$c$ of the selected transparent conductive layer 5', and the second pattern 43$c$ of the additional metal layer 43 is electrically connected to the first pattern 5'$c$ of the selected transparent conductive layer 5'. The first voltage signal transmission structure 2 further includes the second pattern 43$c$ in the additional metal layer 43.

In some embodiments, the second pattern 43$c$ of the additional metal layer 43 is in direct contact with the first pattern 5'$c$ of the selected transparent conductive layer 5', the second pattern 43$c$ of the additional metal layer 43 is located on a side of the first pattern 5'$c$ of the selected transparent conductive layer 5' away from the substrate 1, and the second pattern 43$c$ of the additional metal layer 43 and the first pattern 5'$c$ of the selected transparent conductive layer 5' overlap.

In some other embodiments, other film structures are included between the additional metal layer 43 and the selected transparent conductive layer 5'. The second pattern 43$c$ of the additional metal layer 43 and the first pattern 5'$c$ of the selected transparent conductive layer 5' are electrically connected by a connecting portion. The above other film structures between the additional metal layer 43 and the selected transparent conductive layer 5' include at least one film layer structure, and the at least one film layer structure is electrically insulated from both the additional metal layer 43 and the selected transparent conductive layer 5'. In this case, for example, the at least one film layer structure includes a connecting via hole for connecting the second pattern 43$c$ of the additional metal layer 43 and the first pattern 5'$c$ of the selected transparent conductive layer 5', and the connecting via hole is filled with conductive material, so that the second pattern 43$c$ of the additional metal layer 43 is electrically connected to the first pattern 5'$c$ of the selected transparent conductive layer 5' by the connecting via hole and the conductive material in the connecting via hole. The conductive material includes a metal material, for example, at least one of aluminum, copper or molybdenum.

For example, the transparent conductive layer 5 is made of a transparent conductive material. Further, the transparent conductive layer 5 is, for example, made of indium tin oxide (ITO) or polymer (PEDOT) of 3,4-ethylenedioxythiophene (EDOT) monomer. The additional metal layer 43 is, for example, made of at least one of aluminum, copper or molybdenum.

The selected transparent conductive layer 5' is at least one of the at least one transparent conductive layer 5. Compared with metal materials, the selected transparent conductive layer 5' has better light transmittance and greater resistance, so that a voltage drop of the first voltage signal (the Vss signal) transmitted by the selected transparent conductive layer 5' may be generated. In some embodiments, the at least one transparent conductive layer 5 includes a first transparent conductive layer 51 and a second transparent conductive layer 52, and then the selected transparent conductive layer 5' includes at least one of the first transparent conductive layer 51 and the second transparent conductive layer 52. In some other embodiments, the at least one transparent conductive layer 5 includes a first transparent conductive layer 51, a second transparent conductive layer 52 and a third transparent conductive layer 53, and then the selected transparent conductive layer 5' includes at least one of the first transparent conductive layer 51, the second transparent conductive layer 52 and the third transparent conductive layer 53.

The second pattern 43$c$ made of the metal material is stacked on the first pattern 5'$c$ (i.e., on a side of the first pattern 5'$c$ away from the substrate 1) used for transmitting the first voltage signal (the Vss signal), so that the resistance of the first pattern 5'$c$ for transmitting the first voltage signal (the Vss signal) may be effectively reduced, thereby optimizing the voltage drop.

For example, the shape of the second pattern 43$c$ is the same as that of the first pattern 5'$c$ of the selected transparent conductive layer 5', and an orthographic projection of the second pattern 43$c$ on the substrate 1 is the same or approximately the same as that of the first pattern 5'$c$ of the selected transparent conductive layer 5' on the substrate 1.

Further, since the second pattern 43$c$ of the additional metal layer 43 has the same shape as the first pattern 5'$c$ of the selected transparent conductive layer 5', in a process of manufacturing the display substrate 10, the first pattern 5'$c$ of the selected transparent conductive layer 5' and the second pattern 43$c$ of the additional metal layer 43 may be formed by using the same mask, only the process is changed, but no additional mask is required. While the voltage drop is optimized, the production cost of the display substrate 10 may not increase.

In some other embodiments, as shown in FIG. 14B, the display substrate 10 further includes an additional metal layer 43, and the additional metal layer 43 is located in the same layer as the selected transparent conductive layer 5'. The second pattern 43$c$ included in the additional metal layer 43 is located at least in a region of the first display region AA1 except for a region where the plurality of first transfer electrodes 5$a$ is located, and the second pattern 43$c$ of the additional metal layer 43 is configured to transmit the first voltage signal (the Vss signal). The first voltage signal transmission structure 2 includes the second pattern 43$c$ of the additional metal layer 43.

The second pattern 43$c$ of the additional metal layer 43 is used to transmit the first voltage signal (the Vss signal). Since the resistance of the metal structure is small, it is conducive to realizing the optimization of the voltage drop of the first voltage signal (the Vss signal).

Embodiments in which the first portion 21 of the first voltage signal transmission structure 2 includes the plurality of first voltage signal lines are introduced below.

It will be noted that, FIGS. 15 to 18 only show the positional relationship between the pixel circuits and the signal lines, and do not represent the upper and lower layer relationship of structures.

In some embodiments, as shown in FIGS. 8, 9A, 9B and 15, the plurality of anodes M in the anode layer 31 includes a plurality of first anodes 311 located in the first display region AA1 and a plurality of second anodes 312 located in the second display region AA2. The plurality of pixel circuits 7 arranged in an array on a side of the substrate 1 include a plurality of first pixel circuits 71, a plurality of second pixel circuits 72 and a plurality of dummy pixel circuits 73. Each first pixel circuit 71 is electrically connected to a first anode 311, each second pixel circuit 72 is electrically connected to a second anode 312, and the plurality of dummy pixel circuits 73 are electrically insulated from the anode layer 31.

The plurality of pixel circuits 7 are arranged into a plurality of pixel circuit columns, at least one pixel circuit column is a normal pixel circuit column 7a, and at least one pixel circuit column is a dummy pixel circuit column 7b. For example, the plurality of pixel circuits 7 are arranged in an array. In the first direction X, at least two pixel circuits 7 are arranged in a column, which is referred to as a pixel circuit column. In the second direction Y, at least two pixel circuits 7 are arranged in a row, which is referred to as a pixel circuit row. The normal pixel circuit column 7a includes multiple first pixel circuits 71 and/or multiple second pixel circuits 72 arranged in the first direction X, and the dummy pixel circuit column 7b includes multiple dummy pixel circuits 73 arranged in the first direction X.

As shown in FIG. 15, the second source-drain conductive layer 42 includes a plurality of voltage signal lines, and each voltage signal line is electrically connected to a pixel circuit column. A voltage signal line passes through a pixel circuit column, and the voltage signal line overlaps and is electrically connected to each pixel circuit in the pixel circuit column.

The plurality of voltage signal lines include a plurality of first voltage signal lines 421 and a plurality of second voltage signal lines 422, the second voltage signal line 422 is electrically connected to the normal pixel circuit column 7a, and the first voltage signal line 421 is electrically connected to the dummy pixel circuit column 7b. Each second voltage signal line 422 is configured to transmit the second voltage signal (the Vdd signal) to each pixel circuit 7 in the pixel circuit column. The plurality of first voltage signal lines 421 are each configured to transmit the first voltage signal (the Vss signal). The first voltage signal transmission structure 2 further includes the plurality of first voltage signal lines 421.

The plurality of sub-pixels in the display region AA include first sub-pixels located in the first display region AA1 and second sub-pixels located in the second display region AA2, and the first pixel circuit 71 electrically connected to the first anode 311 is used to control the first sub-pixel, and the second pixel circuit 72 electrically connected to the second anode 312 is used to control the second sub-pixel. The plurality of dummy pixel circuits 73 are redundant pixel circuits, and do not control the sub-pixels.

The plurality of pixel circuits 7 are located in the first display region AA1. The transparent conductive layer 5 further includes a plurality of connecting wires 5d, and each connecting wire 5d is used to connect a pixel circuit 7 and a second anode 312. Each first pixel circuit 71 is connected to a first anode 311 by a connecting wire 5d, and each second pixel circuit 72 is connected to a second anode 312 by a connecting wire 5d.

It can be understood that the first pixel circuits 71 for controlling the first sub-pixels in the first display region AA1 are interspersed with the second pixel circuits 72 for controlling the second sub-pixels in the second display region AA2.

As shown in FIG. 15, the normal pixel circuit column 7a includes multiple first pixel circuits 71 and/or multiple second pixel circuits 72, and the dummy pixel circuit column 7b includes multiple dummy pixel circuits 73.

Each pixel circuit 7 needs to receive the second voltage signal (the Vdd signal). In some embodiments, the plurality of first voltage signal lines 421 and the plurality of second voltage signal lines 422 all serve as the second voltage signal transmission lines and are each configured to transmit the second voltage signal (the Vdd signal). In this way, the first pixel circuit 71 and/or the second pixel circuit 72 and the dummy pixel circuit 73 all receive the second voltage signal (the Vdd signal). Since the plurality of dummy pixel circuits 73 are redundant pixel circuits, which do not control the sub-pixels and are not electrically connected to the anode M, whether the dummy pixel circuit 73 receives the second voltage signal (the Vdd signal) will not affect the normal display of the display substrate 10.

For example, the normal pixel circuit columns 7a and the dummy pixel circuit columns 7b are alternately arranged in the second direction Y.

In some embodiments, as shown in FIG. 16, a dummy pixel circuit column 7b is provided between two adjacent normal pixel circuit columns 7a. In the second direction Y, for example, normal pixel circuit columns 7a and dummy pixel circuit columns 7b are arranged alternately in an order of a normal pixel circuit column 7a and a dummy pixel circuit column 7b.

In some other embodiments, as shown in FIG. 17, two dummy pixel circuit columns 7b are provided between two adjacent normal pixel circuit columns 7a. In the second direction Y, for example, normal pixel circuit columns 7a and dummy pixel circuit columns 7b are arranged alternately in an order of a normal pixel circuit column 7a and two dummy pixel circuit columns 7b.

In yet other embodiments, as shown in FIG. 18, two normal pixel circuit columns 7a are provided between two adjacent dummy pixel circuit columns 7b. In the second direction Y, for example, normal pixel circuit columns 7a and dummy pixel circuit columns 7b are arranged alternately in an order of two normal pixel circuit columns 7a and a dummy pixel circuit column 7b.

In some embodiments of the present disclosure, as shown in FIG. 15, the plurality of first voltage signal lines 421 are each configured to transmit the first voltage signal (the Vss signal), and the first voltage signal transmission structure 2 further includes the plurality of first voltage signal lines 421. A part of the plurality of second voltage signal lines 422 are each configured to transmit the second voltage signal (the Vdd signal) and used as the second voltage signal transmission line. The second voltage signal line 422 (originally used to transmit the second voltage signal (the Vdd signal)) connected to the dummy pixel circuit 73 is used to transmit the first voltage signal (the Vss signal). In this way, multiple second voltage signal lines 422 are used to transmit the first voltage signal (the Vss signal) without affecting the display effect, so that the multiple second voltage signal lines 422 are used as a part of the first voltage signal transmission structure 2, and thus the first voltage signal transmission structure 2 is arranged in the display region AA, thereby achieving an effect of reducing the voltage drop of the first voltage. As a result, the dimension, such as the dimension e3 shown in FIG. 3, of the second portion 22 of the first voltage signal transmission structure 2 located in the peripheral region AN may be reduced, and the dimension, such as the dimension e4 shown in FIG. 3, of the bezel of the display substrate 10 may be reduced.

In some embodiments, the plurality of first voltage signal lines 421 are electrically connected to the first pattern of the selected transparent conductive layer in the peripheral region AN. In this way, the plurality of first voltage signal lines 421 receive the first voltage signal transmitted by the transparent conductive layer, and the plurality of first voltage signal lines 421 and the transparent conductive layer are connected in the peripheral region. The original structure of all film layers in the display region may not change, and the pattern distribution of all the film layer structures in display region will not be affected.

The plurality of first voltage signal lines 421 and the first pattern of the selected transparent conductive layer are all configured to transmit the first voltage signal (the Vss signal). Since the first pattern of the selected transparent conductive layer is arranged in the display region AA, the first pattern of the selected transparent conductive layer may be connected to the light-emitting device layer 3 in the display region AA. Therefore, a dimension (the dimension in a direction perpendicular to an edge of the display region AA to which the first voltage signal line is close) of a portion of each of the plurality of first voltage signal lines 421 located in the peripheral region and a dimension (the dimension in a direction perpendicular to an edge of the display region AA to which the selected transparent conductive layer is close) of a portion of the selected transparent conductive layer located in the peripheral region only need to ensure the effective connection between the selected transparent conductive layer and the plurality of first voltage signal lines 421. Further, since a dimension of a portion of a connecting wire (e.g., the plurality of first voltage signal lines 421 and the first pattern of the selected transparent conductive layer) located in the peripheral region AN is reduced, it can be understood that, the proportion of the display region AA of the display substrate 10 increases accordingly, and the bezel of the display apparatus may be further narrowed.

In some embodiments, as shown in FIGS. 13A, 16 and 17, the display substrate 10 further includes a plurality of pixel circuits 7 disposed in an array on a side of the substrate 1, a gate conductive layer 8 disposed on the side of the substrate 1, a first source-drain conductive layer 41 disposed on a side of the gate conductive layer 8 away from the substrate 1, and a second source-drain conductive layer 42 disposed on a side of the first source-drain conductive layer 41 away from the substrate 1. The plurality of pixel circuits 7 are arranged into a plurality of pixel circuit columns. The second source-drain conductive layer 42 includes a plurality of voltage signal lines extending in a first direction X. The first direction X is an extension direction of the plurality of pixel circuit columns, and each voltage signal line overlaps with a pixel circuit column.

The gate conductive layer 8 includes, for example, a first gate conductive layer 8a and a second gate conductive layer 8b, and the first gate conductive layer 8a is closer to the substrate 1 than the second gate conductive layer 8b.

The plurality of voltage signal lines include a plurality of first voltage signal lines 421 and a plurality of second voltage signal main lines 423. For example, the plurality of first voltage signal lines 421 are each configured to transmit the first voltage signal (the Vss signal). The first voltage signal transmission structure 2 further includes the plurality of first voltage signal lines 421.

Each second voltage signal main line 423 is electrically connected to a pixel circuit column, and is configured to transmit a second voltage signal (a Vdd signal) to each pixel circuit in the pixel circuit column. The gate conductive layer 8 includes a plurality of second voltage signal auxiliary lines 81 extending in the second direction Y, and the plurality of second voltage signal auxiliary lines 81 are electrically connected to the second voltage signal main line 423. The plurality of second voltage signal auxiliary lines 81 are each configured to transmit the second voltage signal (the Vdd signal) to the pixel circuits 7 overlapping with the first voltage signal line 421.

For example, the first direction X and the second direction Y cross. Further, the first direction X is perpendicular to the second direction Y.

As shown in FIG. 16, portions of the plurality of second voltage signal main lines 423 located in the display region AA and portions of the plurality of second voltage signal auxiliary lines 81 located in the display region AA constitute a mesh structure. The portions of the plurality of second voltage signal main lines 423 located in the display region AA and the portions of the plurality of second voltage signal auxiliary lines 81 located in the display region AA are connected to the pixel circuits 7 and used as the second voltage signal transmission lines (i.e., VDD signal lines) to transmit the second voltage signal (the Vdd signal). Portions of the plurality of second voltage signal main lines 423 located in the peripheral region AN and portions of the plurality of second voltage signal auxiliary lines 81 located in the peripheral region AN are connected.

In some embodiments, the plurality of second voltage signal main lines 423 and the plurality of second voltage signal auxiliary lines 81 are all used as the VDD signal lines to transmit the second voltage signal (the Vdd signal).

In some embodiments of the present disclosure, the second voltage signal main line 423 is used as the VDD signal line to transmit the second voltage signal (the Vdd signal), and the first voltage signal line 421 between two adjacent second voltage signal main lines 423 is used as the first voltage signal transmission line (i.e., a VSS signal line) to transmit the first voltage signal (the Vss signal). In this case, the second voltage signal (the Vdd signal) required by the pixel circuits 7 overlapping with the second voltage signal main line 423 is provided by the plurality of second voltage signal auxiliary lines 81 in the gate conductive layer 8.

Further, as shown in FIGS. 16, 17, and 18, at least one first voltage signal line 421 is provided between every two adjacent second voltage signal main lines 423 in the plurality of second voltage signal main lines 423, and/or, at least one second voltage signal main line 423 is provided between every two adjacent first voltage signal lines 421.

Figure 19:
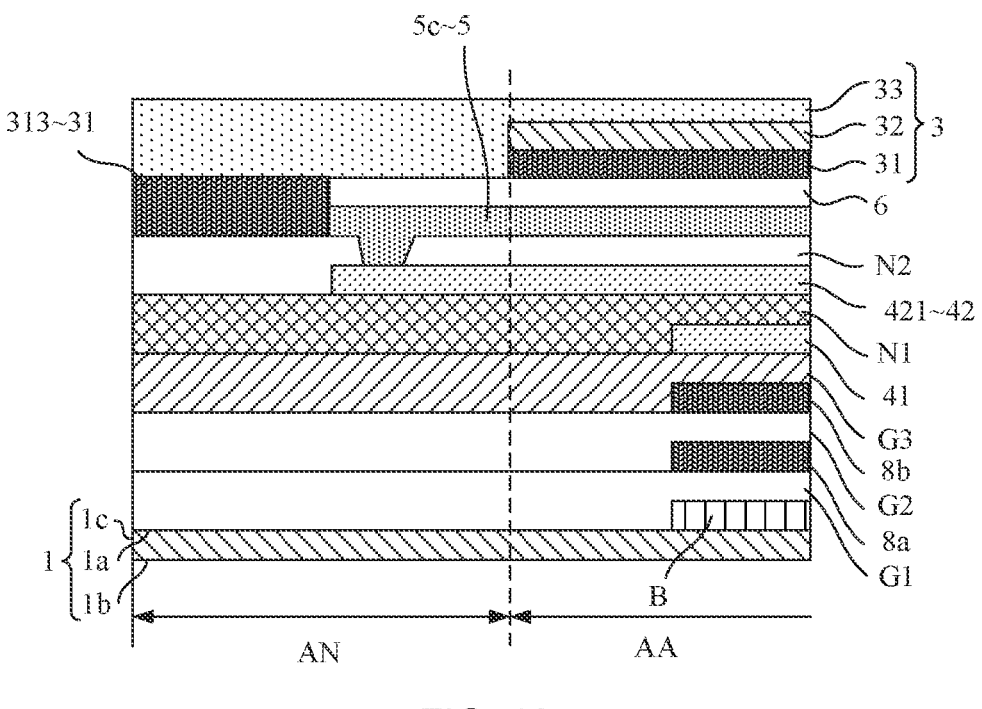
FIG. 19 is a sectional view of a structure of film layers in a peripheral region of yet another display substrate, in accordance with some embodiments.

Further, as shown in FIG. 19, the display substrate 10 further includes at least one transparent conductive layer 5 and at least one planarization layer 6 disposed on a side of the second source-drain conductive layer 42 away from the substrate 1. At least one transparent conductive layer in the at least one transparent conductive layer 5 is a selected transparent conductive layer, and a first pattern of the selected transparent conductive layer is electrically connected to the plurality of first voltage signal lines 421 in the peripheral region AN.

In some embodiments, the transparent conductive layer(s) 5 include a first transparent conductive layer 51, a second transparent conductive layer 52 and a third transparent conductive layer 53. The first transparent conductive layer 51 and the third transparent conductive layer 53 include a plurality of second voltage signal main lines 423 extending in the first direction X, and the plurality of second voltage signal main lines 423 included in the first transparent conductive layer 51 and the third transparent conductive layer 53 are used as the VDD signal lines and configured to transmit the second voltage signal (the Vdd signal). The second transparent conductive layer 52 includes a plurality of first voltage signal lines 421 extending in the first direction X, and the plurality of first voltage signal lines 421 included in the second transparent conductive layer 52 are used as the VSS signal lines and configured to transmit the first voltage signal (the Vss signal).

The second voltage signal (the Vdd signal) is transmitted by the plurality of second voltage signal main lines 423 in the first transparent conductive layer 51 and the third transparent conductive layer 53, and the first voltage signal (the Vss signal) is transmitted by the plurality of first voltage signal lines 421 included in the second transparent conductive layer 52. The second transparent conductive layer 52 is surrounded between the first transparent conductive layer 51 and the third transparent conductive layer 53. Since the second voltage signal (the Vdd signal) is more stable than the first voltage signal (the Vss signal), so that the first voltage signal (the Vss signal) transmitted in the second transparent conductive layer 52 may be stable, so as to ensure the stable transmission of the signals required for work of the display substrate 10, thereby avoiding an increase in power consumption of the display apparatus due to unstable transmission of the first voltage signal (the Vss signal).

In some embodiments, as shown in FIGS. 20A and 20B, the display substrate 10 further includes a light-shielding layer 9 disposed on a side of the substrate 1 and a plurality of pixel circuits 7 disposed on a side of the light-shielding layer 9 away from the substrate 1. Each pixel circuit 7 in the plurality of pixel circuits 7 includes a driving transistor T0. The light-shielding layer 9 includes a plurality of light-shielding patterns 91, and an orthographic projection of the driving transistor T0 of each pixel circuit 7 on the substrate 1 is within an orthographic projection of a light-shielding pattern 91 on the substrate 1. The plurality of light-shielding patterns 91 are connected. The light-shielding layer 9 is configured to transmit the first voltage signal (the Vss signal), and the first voltage signal transmission structure 2 includes the light-shielding layer 9.

For example, the light-shielding layer 9 serves as an isolation layer and is disposed between the driving transistor T0 and the substrate 1. Each light-shielding layer 9 corresponds to at least one driving transistor T0, so as to avoid ion transport between the driving transistor T0 and conductive structure(s) on a side of the second surface 1*b* of substrate 1, and avoid abnormality of the driving transistor T0 caused by the light irradiating from the second surface 1*b* of substrate 1 to the driving transistor T0 on a side of the substrate 1 in a case where the substrate 1 is made of a transparent material such as glass, thereby ensuring the normal operation of the display substrate 10.

Each light-shielding pattern 91 covers a driving transistor T0, and the plurality of light-shielding patterns 91 are connected by connection lines 92. It can be understood that the plurality of light-shielding patterns 91 have an integral structure.

In some embodiments, as shown in FIG. 21, the display substrate 10 further includes source-drain conductive layers 4, and the source-drain conductive layers 4 include a first source-drain conductive layer 41 and a second source-drain conductive layer 42 arranged sequentially from the substrate 1. The second portion 22 of the first voltage signal transmission structure 2 includes a first voltage signal bus, and the first portion 21 of the first voltage signal transmission structure 2 includes a plurality of first voltage signal sublines 211. The first voltage signal bus is located in the first source-drain conductive layer 41, and/or the first voltage signal bus is located in the second source-drain conductive layer 42. The dimension of the first voltage signal bus in a direction perpendicular to an extending direction of the first voltage signal bus is in a range of 5 μm to 20 μm, inclusive.

For example, as shown in FIG. 21, the first voltage signal bus includes a first bus 221 and a second bus 222. A dimension d7 of the first bus 221 in a direction perpendicular to an extending direction of the first bus 221 is in a range of 5 μm to 20 μm, inclusive, and a dimension d8 of the second bus 222 in a direction perpendicular to an extending direction of the second bus 222 is in a range of 5 μm to 20 μm, inclusive.

The dimension d7 of the first bus 221 in the direction perpendicular to the extending direction of the first bus 221 is, for example, 5 μm, 15 μm or 20 μm. The dimension d8 of the second bus 222 in the direction perpendicular to the extending direction of the second bus 222 is, for example, 5 μm, 15 μm or 20 μm.

For the connecting wire for transmitting the VSS signal, such as the first bus 221 and the second bus 222 shown in FIG. 21, a portion of the connecting wire located in the peripheral region AN has a small width. It can be understood that accordingly, in a case where the display substrate 10 is applied in a display apparatus, an ultra-narrow bezel of the display apparatus may be realized.

Figure 22:
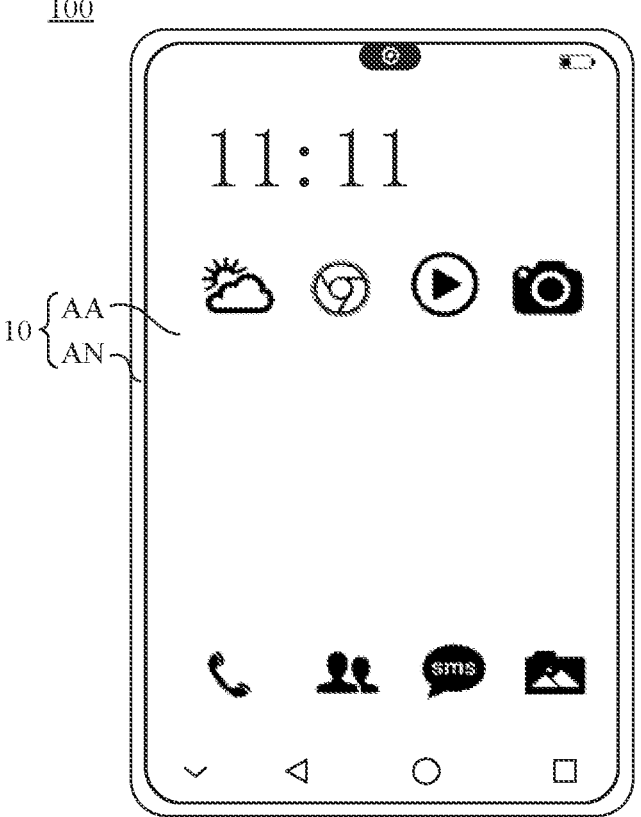
FIG. 22 is a structural diagram of a display apparatus, in accordance with some embodiments.

Some embodiments of the disclosure further provide a display apparatus 100. As shown in FIG. 22, the display apparatus 100 includes the display substrate 10 provided by any of the above embodiments.

The display apparatus 100 may be any apparatus that displays images whether in motion (such as a video) or fixed (such as a still image), and regardless of text or image. More specifically, it is expected that the described embodiments may be implemented in or associated with a variety of electronic devices. The variety of electronic devices may include (but are not limit to), for example, mobile phones, wireless devices, personal digital assistants (PDA), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (such as odometer displays), navigators, cockpit controllers and/or displays, camera view displays (such as rear view camera displays in vehicles), electronic photos, electronic billboards or signs, projectors, architectural structures, packaging and aesthetic structures (such as displays for displaying an image of a piece of jewelry), etc.

Figure 23:
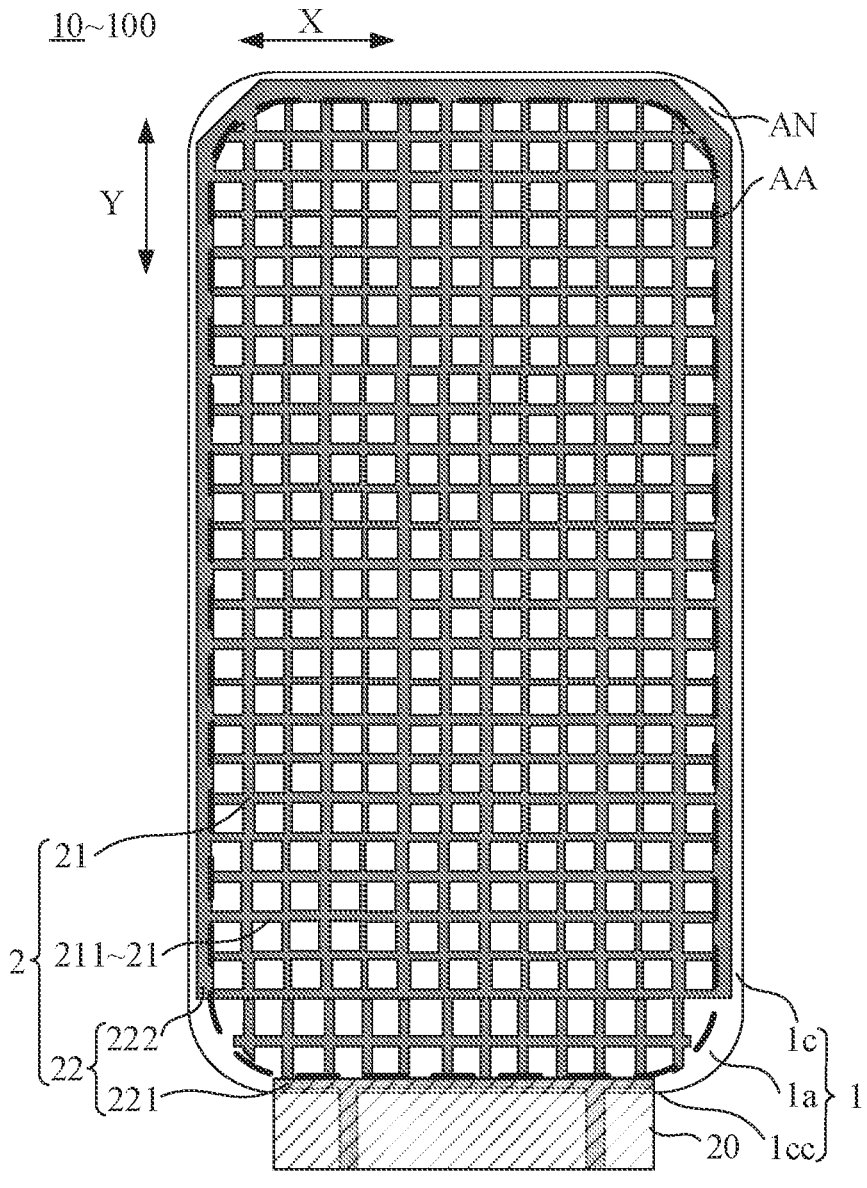
FIG. 23 is a structural diagram of a display substrate bonded to a circuit board, in accordance with some embodiments.

For example, referring to FIGS. 22 and 23, the display apparatus 100 may further include a frame, a flexible circuit board 20, and other electronic components. The display substrate 10 may be, for example, arranged in the frame.

In some examples, the display substrate 10 further includes bonding leads extending in the second direction Y. One end of the bonding lead is connected to the first bus 221, and the other end of the bonding lead is used to be bonded to the flexible circuit board 20. Portions of the bonding leads located outside the peripheral region AN (the portions beyond the substrate 1) are bent to a back surface of the display substrate 10 together with the flexible circuit board 20.

Beneficial effects of the display apparatus are the same as those of the display substrate 10 described in the above embodiments, which are not be repeated herein.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display region and a peripheral region around the display region, the display substrate comprising:
   a substrate;

a light-emitting device layer disposed on a side of the substrate, the light-emitting device layer including an anode layer and a cathode layer, and the anode layer is closer to the substrate than the cathode layer;

a first voltage signal transmission structure disposed between the light-emitting device layer and the substrate, and configured to transmit a first voltage signal to the cathode layer;

a first source-drain conductive layer disposed on the side of the substrate; and a second source-drain conductive layer disposed on a side of the first source-drain conductive layer away from the substrate, wherein the first voltage signal transmission structure includes a first portion located in the display region and a second portion located in the peripheral region, and the first portion is electrically connected to the second portion;

the first voltage signal transmission structure is located between the second source-drain conductive layer and the anode layer;

the anode layer includes a plurality of anodes located in the display region and an overlapping anode located in the peripheral region; the overlapping anode is electrically insulated from the plurality of anodes; and the second portion of the first voltage signal transmission structure is electrically connected to the cathode layer by the overlapping anode.

2. The display substrate according to claim 1, wherein the first portion includes a pattern in a mesh structure; and/or the first portion includes a plurality of first voltage signal lines.

3. The display substrate according to claim 1, wherein a boundary of the display region includes a plurality of boundary lines, and a boundary line in the plurality of boundary lines is a selected boundary line;

the second portion of the first voltage signal transmission structure includes a first bus and a second bus;

the first bus extends in an extension direction of the selected boundary line and is configured to receive a first voltage signal; and the second bus is disposed on a periphery of remaining boundary lines, except for the selected boundary line, in the plurality of boundary lines, and an orthographic projection of the second bus on the substrate and an orthographic projection of the first bus on the substrate have no overlap.

4. The display substrate according to claim 3, wherein the first portion of the first voltage signal transmission structure is connected to the second bus; and the first voltage signal transmission structure further includes a plurality of connecting lines, and the first portion of the first voltage signal transmission structure is connected to the first bus through the plurality of connecting lines.

5. The display substrate according to claim 1, wherein the display region includes a first display region and a second display region, and the first display region surrounds the second display region;

the plurality of anodes include a plurality of first anodes located in the first display region and a plurality of second anodes located in the second display region;

the display substrate further comprises a plurality of pixel circuits disposed on the side of the substrate, the plurality of pixel circuits are located in the first display region and not located in the second display region; and the display substrate further comprises one or more transparent conductive layers disposed on a side of the second source-drain conductive layer away from the substrate, wherein each transparent conductive layer includes:

a plurality of first transfer electrodes located in the first display region, each first transfer electrode being electrically connected to a first anode in the anode layer;

a plurality of second transfer electrodes located in the second display region, each second transfer electrode being electrically connected to a second anode in the anode layer; and a first pattern located at least in a part of a region of the first display region except for a region where the plurality of first transfer electrodes are located, the first pattern including a plurality of mesh holes; and at least one transparent conductive layer in the one or more transparent conductive layers is a selected transparent conductive layer, and a first pattern of the selected transparent conductive layer is configured to transmit the first voltage signal, and the first portion of the first voltage signal transmission structure includes a portion of the first pattern of the selected transparent conductive layer located in the display region.

6. The display substrate according to claim 5, wherein each transparent conductive layer in the one or more transparent conductive layers is the selected transparent conductive layer; the first pattern of the selected transparent conductive layer is further located in the peripheral region, and the second portion of the first voltage signal transmission structure includes a portion of the first pattern of the selected transparent conductive layer located in the peripheral region;

the first pattern of each transparent conductive layer is used as the first voltage signal transmission structure;

portions of all of the one or more transparent conductive layers located in the peripheral region are electrically connected; and a portion, located in the peripheral region, of a first pattern of a transparent conductive layer farthest away from the substrate in the one or more transparent conductive layers is connected to the overlapping anode.

7. The display substrate according to claim 6, wherein a surface of the substrate on which the one or more transparent conductive layers are disposed includes a plurality of sides;

the one or more transparent conductive layers include a first transparent conductive layer, a second transparent conductive layer, and a third transparent conductive layer that are disposed sequentially from the substrate;

the display substrate further comprises at least one planarization layer, and the at least one planarization layer includes:

a first planarization layer located between the first transparent conductive layer and the second transparent conductive layer;

a second planarization layer located between the second transparent conductive layer and the third transparent conductive layer; and a third planarization layer located on a side of the third transparent conductive layer away from the substrate;

a distance between an edge of an orthographic projection of the third planarization layer on the substrate and a side of the substrate to which the edge is close is greater than a distance between an edge of an orthographic projection of the second planarization layer on the substrate and the side of the substrate; and the distance between the edge of the orthographic projection of the second planarization layer on the substrate and the side of the substrate is greater than a distance between an edge of an orthographic projection of the first planarization layer on the substrate and the side of the substrate;

a distance between an edge of an orthographic projection of the one or more transparent conductive layers on the substrate and the side of the substrate to which the edge is close is smaller than the distance between the edge of the orthographic projection of the first planarization layer on the substrate and the side of the substrate to which the edge is close; and the portion of the first pattern used as the first voltage signal transmission structure located in the peripheral region is connected to the overlapping anode.

8. The display substrate according to claim 5, wherein the one or more transparent conductive layers include a first transparent conductive layer, a second transparent conductive layer, and a third transparent conductive layer that are disposed sequentially from the substrate;

a first pattern of the second transparent conductive layer is used as the first voltage signal transmission structure; the first pattern of the second transparent conductive layer is further located in the peripheral region; and a portion of the first pattern of the second transparent conductive layer located in the peripheral region is connected to the overlapping anode;

a first pattern of the first transparent conductive layer and a first pattern of the third transparent conductive layer are configured to transmit a second voltage signal to the plurality of pixel circuits.

9. The display substrate according to claim 5, further comprising an additional metal layer, the additional metal layer including a second pattern, wherein the additional metal layer is located in a same layer as the selected transparent conductive layer; the second pattern of the additional metal layer is located at least in a part of a region of the first display region except for the region where the plurality of first transfer electrodes are located; the second pattern of the additional metal layer is configured to transmit the first voltage signal, and the first voltage signal transmission structure includes the second pattern of the additional metal layer; or the additional metal layer is disposed on a side of the selected transparent conductive layer away from the substrate; the second pattern of the additional metal layer is disposed on a side of the first pattern of the selected transparent conductive layer, and the second pattern of the additional metal layer is electrically connected to the first pattern of the selected transparent conductive layer; and the first voltage signal transmission structure further includes the second pattern of the additional metal layer.

10. The display substrate according to claim 5, wherein the plurality of pixel circuits are arranged in an array, and include a plurality of first pixel circuits, a plurality of second pixel circuits and a plurality of dummy pixel circuits; each first pixel circuit is electrically connected to a first anode, and each second pixel circuit is electrically connected to a second anode; the plurality of dummy pixel circuits are electrically insulated from the anode layer;

the plurality of pixel circuits are arranged into a plurality of pixel circuit columns, at least one pixel circuit column is a normal pixel circuit column, and at least one pixel circuit column is a dummy pixel circuit column; the normal pixel circuit column includes first pixel circuits and/or second pixel circuits; and the dummy pixel circuit column includes dummy pixel circuits;

the second source-drain conductive layer includes a plurality of voltage signal lines, and each voltage signal line is electrically connected to a pixel circuit column; the plurality of voltage signal lines include a plurality of first voltage signal lines and a plurality of second voltage signal lines, each second voltage signal line is electrically connected to a corresponding normal pixel circuit column, and each first voltage signal line is electrically connected to a corresponding dummy pixel circuit column;

each second voltage signal line is configured to transmit a second voltage signal to each pixel circuit in the corresponding normal pixel circuit column; the plurality of first voltage signal lines are configured to transmit the first voltage signal; and the first voltage signal transmission structure further includes the plurality of first voltage signal lines.

11. The display substrate according to claim 10, wherein the first pattern of the selected transparent conductive layer is further located in the peripheral region, and the plurality of first voltage signal lines are electrically connected to the first pattern of the selected transparent conductive layer in the peripheral region.

12. The display substrate according to claim 10, further comprising a plurality of pixel circuits disposed on the side of the substrate, wherein the plurality of pixel circuits are arranged in an array, and the plurality of pixels circuits are arranged into a plurality of pixel circuit columns;

the display substrate further comprises:

a gate conductive layer disposed on the side of the substrate, wherein the first source-drain conductive layer is disposed on a side of the gate conductive layer away from the substrate;

the second source-drain conductive layer includes a plurality of voltage signal lines extending in a first direction, and each voltage signal line overlaps with a pixel circuit column; the plurality of voltage signal lines include a plurality of first voltage signal lines and a plurality of second voltage signal main lines; each second voltage signal main line is electrically connected to a pixel circuit column, and is configured to transmit a second voltage signal to each pixel circuit in the pixel circuit column connected thereto; the first direction is an extending direction of the plurality of pixel circuit columns;

the gate conductive layer includes a plurality of second voltage signal auxiliary lines extending in a second direction; and the plurality of second voltage signal auxiliary lines are electrically connected to the second voltage signal main line; the plurality of second voltage signal auxiliary lines are configured to transmit the second voltage signal to pixel circuits overlapping with a first voltage signal line;

the plurality of first voltage signal lines are configured to transmit the first voltage signal; and the first voltage signal transmission structure further includes the plurality of first voltage signal lines.

13. The display substrate according to claim 1, further comprising a plurality of pixel circuits disposed on the side of the substrate, wherein the plurality of pixel circuits are arranged in an array, and the plurality of pixels circuits are arranged into a plurality of pixel circuit columns;

the display substrate further comprises:

a gate conductive layer disposed on the side of the substrate, wherein the first source-drain conductive layer is disposed on a side of the gate conductive layer away from the substrate;

the second source-drain conductive layer includes a plurality of voltage signal lines extending in a first direction, and each voltage signal line overlaps with a pixel circuit column;

the plurality of voltage signal lines include a plurality of first voltage signal lines and a plurality of second voltage signal main lines; each second voltage signal main line is electrically connected to a pixel circuit column, and is configured to transmit a second voltage signal to each pixel circuit in the pixel circuit column connected thereto; the first direction is an extending direction of the plurality of pixel circuit columns;

the gate conductive layer includes a plurality of second voltage signal auxiliary lines extending in a second direction; and the plurality of second voltage signal auxiliary lines are electrically connected to the second voltage signal main line; the plurality of second voltage signal auxiliary lines are configured to transmit the second voltage signal to pixel circuits overlapping with a first voltage signal line;

the plurality of first voltage signal lines are configured to transmit the first voltage signal; and the first voltage signal transmission structure further includes the plurality of first voltage signal lines.

14. The display substrate according to claim 13, wherein at least one first voltage signal line in the plurality of first voltage signal lines is disposed between every two adjacent second voltage signal main lines in the plurality of second voltage signal main lines, and/or at least one second voltage signal main line in the plurality of second voltage signal main lines is disposed between every two adjacent first voltage signal lines in the plurality of first voltage signal lines.

15. The display substrate according to claim 13, further comprising one or more transparent conductive layers disposed on a side of the second source-drain conductive layer away from the substrate, and at least one planarization layer disposed on the side of the second source-drain conductive layer away from the substrate, wherein at least one transparent conductive layer in the one or more transparent conductive layers is a selected transparent conductive layer, the selected transparent conductive layer includes a first pattern located in both the display region and the peripheral region, and the first pattern of the selected transparent conductive layer is electrically connected to the plurality of first voltage signal lines in the peripheral region.

16. The display substrate according to claim 1, further comprising:

a light-shielding layer disposed on the side of the substrate; and a plurality of pixel circuits disposed on a side of the light-shielding layer away from the substrate, each pixel circuit in the plurality of pixel circuits including a driving transistor, wherein the light-shielding layer includes a plurality of light-shielding patterns; an orthographic projection of the driving transistor of each pixel circuit on the substrate is within an orthographic projection of a light-shielding pattern on the substrate; the plurality of light-shielding patterns are connected together; and the light-shielding layer is configured to transmit the first voltage signal, and the first voltage signal transmission structure further includes the light-shielding layer.

17. A display apparatus, comprising the display substrate according to claim 1.

18. A display substrate having a display region and a peripheral region around the display region, the display substrate comprising:

a substrate;

a light-emitting device layer disposed on a side of the substrate, the light-emitting device layer including an anode layer and a cathode layer, and the anode layer is closer to the substrate than the cathode layer;

a first voltage signal transmission structure disposed between the light-emitting device layer and the substrate, and configured to transmit a first voltage signal to the cathode layer; and a first source-drain conductive layer and a second source-drain conductive layer that are sequentially disposed from the substrate, wherein the first voltage signal transmission structure includes a first portion located in the display region and a second portion located in the peripheral region, and the first portion is electrically connected to the second portion;

the second portion of the first voltage signal transmission structure includes a first voltage signal bus, and the first portion of the first voltage signal transmission structure includes a plurality of first voltage signal sub-lines;

the first voltage signal bus is located in the first source-drain conductive layer and/or located in the second source-drain conductive layer; and a dimension of the first voltage signal bus in a direction perpendicular to an extending direction thereof is in a range of 5 μm to 20 μm, inclusive.

* * * * *